(12) United States Patent
Sims, Jr.

(10) Patent No.: US 8,370,118 B2
(45) Date of Patent: *Feb. 5, 2013

(54) SYSTEMS, METHODS, AND TOOLS FOR PROOFING A COMPUTER-AIDED DESIGN OBJECT

(75) Inventor: Dewey McKinley Sims, Jr., Royal Oak, MI (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/267,144

(22) Filed: Oct. 6, 2011

(65) Prior Publication Data

US 2012/0078591 A1 Mar. 29, 2012

Related U.S. Application Data

(63) Continuation of application No. 12/247,837, filed on Oct. 8, 2008, now Pat. No. 8,065,116.

(51) Int. Cl.
*G06F 17/50* (2006.01)

(52) U.S. Cl. ................... 703/1; 700/98; 700/103

(58) Field of Classification Search .............. 703/1
See application file for complete search history.

(56) References Cited

U.S. PATENT DOCUMENTS

| | | | |
|---|---|---|---|
| 5,006,990 A | 4/1991 | Ward et al. |
| 5,323,333 A | 6/1994 | Johnson |
| 5,341,469 A | 8/1994 | Rossberg et al. |
| 5,351,203 A | 9/1994 | Hoffman et al. |
| 5,444,840 A | 8/1995 | Froessl |
| 5,465,221 A | 11/1995 | Merat et al. |
| 5,552,995 A | 9/1996 | Sebastian |
| 5,581,468 A | 12/1996 | White et al. |
| 5,586,052 A | 12/1996 | Iannuzzi et al. |
| 5,687,094 A | 11/1997 | Kagawa et al. |
| 5,689,435 A | 11/1997 | Umney et al. |
| 5,734,572 A | 3/1998 | Guignet |
| 5,771,044 A | 6/1998 | Cragun et al. |
| 5,845,288 A | 12/1998 | Syeda-Mahmood |
| 5,895,473 A | 4/1999 | Williard et al. |
| 5,940,309 A | 8/1999 | White et al. |
| 5,956,251 A | 9/1999 | Atkinson et al. |
| 5,995,659 A | 11/1999 | Chakraborty et al. |
| 6,134,338 A | 10/2000 | Solberg et al. |

(Continued)

FOREIGN PATENT DOCUMENTS

| | | |
|---|---|---|
| EP | 550268 | 5/1996 |
| EP | 1050786 | 11/2000 |

(Continued)

OTHER PUBLICATIONS

"SolidWorksTolAnalyst frequently asked questions", downloaded from http://www.javelin-tech.com/main/support/pdf/tolanalyst.pdf (7 pages).

(Continued)

*Primary Examiner* — Mary C Jacob
(74) *Attorney, Agent, or Firm* — Michael Best & Friedrich LLP

(57) ABSTRACT

A casting tolerance proofing tool adapted to be implemented with a computer system. The computer system has a processor and a memory storing a CAD object of an apparatus to be manufactured with a casting process. The proofing tool includes a criteria selector operable to prompt for and receive a type of casting process for the apparatus to be manufactured with, and an extractor operable to determine a nominal dimension and a related tolerance from the CAD object. The proofing tool further includes a comparator operable to compare the tolerance with a first threshold and a second threshold.

19 Claims, 23 Drawing Sheets

U.S. PATENT DOCUMENTS

| | | | |
|---|---|---|---|
| 6,192,381 B1 | 2/2001 | Stiegemeier et al. |
| 6,220,743 B1 | 4/2001 | Campestre et al. |
| 6,232,985 B1 | 5/2001 | Chase et al. |
| 6,484,063 B1 | 11/2002 | Liou et al. |
| 6,490,498 B1 | 12/2002 | Takagi |
| 6,571,484 B2 | 6/2003 | Hastilow |
| 6,718,218 B1 | 4/2004 | Matheson |
| 6,725,184 B1 | 4/2004 | Gadh et al. |
| 6,738,507 B2 | 5/2004 | Liasi et al. |
| 6,825,856 B1 | 11/2004 | Fazzio et al. |
| 6,826,510 B2 | 11/2004 | Gong et al. |
| 6,856,842 B2 | 2/2005 | Rebello et al. |
| 6,856,846 B2 | 2/2005 | Fuki et al. |
| 6,864,885 B2 | 3/2005 | Fujita |
| 6,879,874 B2 | 4/2005 | Sinn |
| 6,879,933 B2 | 4/2005 | Steffey et al. |
| 6,912,445 B2 | 6/2005 | Shiroyama et al. |
| 6,963,824 B1 | 11/2005 | Davidson et al. |
| 6,978,220 B2 | 12/2005 | Wilson |
| 6,993,708 B1 | 1/2006 | Gillig |
| 7,024,342 B1 | 4/2006 | Waite et al. |
| 7,058,623 B2 | 6/2006 | Wong |
| 7,117,055 B2 | 10/2006 | Mateau et al. |
| 7,123,985 B2 | 10/2006 | Wildsmith et al. |
| 7,130,708 B2 | 10/2006 | Wang et al. |
| 7,130,774 B2 | 10/2006 | Thomas et al. |
| 7,133,733 B2 | 11/2006 | Okada et al. |
| 7,212,883 B2 | 5/2007 | Hollingshead et al. |
| 7,275,225 B2 | 9/2007 | Kamat |
| 7,280,948 B2 | 10/2007 | Duggirala |
| 7,317,963 B2 | 1/2008 | Hu et al. |
| 7,327,869 B2 | 2/2008 | Boyer |
| 7,398,129 B2 | 7/2008 | Ishii et al. |
| 7,415,400 B2 | 8/2008 | Zhu et al. |
| 7,477,262 B2 | 1/2009 | Tomquist et al. |
| 7,590,497 B2 | 9/2009 | Tomquist et al. |
| 2002/0143507 A1 | 10/2002 | Lu et al. |
| 2003/0069869 A1 | 4/2003 | Grohau et al. |
| 2003/0171841 A1 | 9/2003 | Porter et al. |
| 2004/0073323 A1 | 4/2004 | Zhu et al. |
| 2004/0148046 A1 | 7/2004 | Fukumura |
| 2004/0267391 A1 | 12/2004 | Bohn et al. |
| 2005/0065960 A1 | 3/2005 | Chao et al. |
| 2005/0071030 A1 | 3/2005 | Itoh |
| 2006/0079989 A1 | 4/2006 | Ishii et al. |
| 2006/0106476 A1 | 5/2006 | Tomquist et al. |
| 2006/0129259 A1 | 6/2006 | Tomquist et al. |
| 2006/0242419 A1 | 10/2006 | Gaffey et al. |
| 2006/0282232 A1 | 12/2006 | Bae et al. |
| 2006/0287755 A1 | 12/2006 | Kubli et al. |
| 2006/0293776 A1 | 12/2006 | Hillman et al. |
| 2007/0075450 A1 | 4/2007 | Belegundu et al. |
| 2007/0124120 A1 | 5/2007 | Hamazoe |
| 2007/0225846 A1 | 9/2007 | Bogan et al. |
| 2008/0003510 A1 | 1/2008 | Harazaki |
| 2008/0004850 A1 | 1/2008 | Wang |
| 2008/0079729 A1 | 4/2008 | Brailovsky |
| 2008/0154572 A1 | 6/2008 | Sims |
| 2010/0005049 A1 | 1/2010 | Kawai et al. |
| 2010/0087939 A1 | 4/2010 | Sims, Jr. |
| 2010/0087940 A1 | 4/2010 | Sims, Jr. |
| 2010/0087942 A1 | 4/2010 | Sims, Jr. |
| 2010/0087943 A1 | 4/2010 | Sims, Jr. |

FOREIGN PATENT DOCUMENTS

| | | |
|---|---|---|
| EP | 1909205 | 4/2008 |
| GB | 2401213 | 11/2004 |
| JP | 6131012 | 5/1994 |
| JP | 2002288238 | 10/2002 |
| WO | WO 9521410 | 8/1995 |
| WO | WO 03079239 | 9/2003 |

OTHER PUBLICATIONS

Beiter, K.A. et al., "Incorporating dimensional requirements into material selection and design of injection molded parts," ASME Design Automation Conference, paper #96-DETC/DAC-1494, Sep. 1996.

Busick, D.R. et al., "Design for Injection Molding: Using Process Simulation to Assess Tolerance Feasibility," The Ohio State University, Department of Mechanical Engineering (1994) 1-8.

Busick, D.R. et al., "Use of Process Simulation to Assess Tolerance Feasibility," available online at http://www-mml.stanford.edu/publications/1995/busick.antec.95/busick.antec.95.html, printed Jun. 20, 2008 (9 pages).

Chen, Y. et al., "Parametric process planning based on feature parameters of parts," Int. J. Adv. Manuf. Technol. (2006) 28:727-736.

Colyer, S., "Decade of 3D CAD Key to Auto Success," available online at http://www.myfen.com.au/articles/decade-of-3D-CAD-key-to-success_z138410.htm, printed Jun. 20, 2008 (3 pages).

Eyada, O.K. et al., "An interactive tolerance system," IEA/AIE '89: Proceedings of the 2nd International Conference on Industrial and Engineering Applications of Artificial Intelligence and Expert Systems (Jun. 1989) vol. 1:178-184.

Feng, S.C. et al., "Incorporating process planning into conceptual design," Proceedings of DETC99, The 1999 ASME Design Engineering Technical Conferences, Sep. 12-15, 1999 in Las Vegas, Nevada (7 pages).

Fuh, J.Y.H. et al., "The development of an integrated and intelligent CAD/CAPP/CAFP environment using logic-based reasoning," Computer-Aided Design (1996) 28(3):217-232.

Krischuk, V. et al., "Interval System for Calculating Tolerances in CAD Systems," VI-th International Conference the Experience of Designing and Application of CAD Systems in Microelectronics, Lviv-Slayski, Ukraine (2001) 204-206.

Krulikowski, A., "Fundamentals of Geometric Dimensioning & Tolerancing," 2nd Edition Metric, Effective Training Inc., United States of America (1997) pp. v-vii.

Lee, S. et al., "Tolerance Analysis for Assembly Planning" IEEE (1994) 306-311.

Li et al., "Developing engineering ontology for information retrieval," J. Computing and Information Science in Engineering (2008) vol. 8, 13 pages.

Lockett, H., "A knowledge based manufacturing advisor for CAD," PhD Thesis, Cranfield University, Jul. 2005.

Madan, J. et al., "Computer aided manufacturability analysis of diecast parts," Computer-Aided Design & Applications (2007) 4(1-4):147-158.

Masuda, H. et al., "Method for Understanding Drawing Attributes for 3D Models," IBM Technical Disclosure Bulletin (1994) 37(7):99-104.

Schlatter, B., "Computer-Aided 3D Tolerance Analysis of Disk Drives," IBM Journal of Research and Development (1996) 40(5):537-542.

Shah, J.J. et al., "Dimension and tolerance modeling and transformations in feature based design and manufacturing," J. Intelligent Mfg. (1998) 9:475-488.

Shehab et al., "Manufacturing cost modelling for concurrent product development," Robotics and Computer Integrated Manufacturing (2001) 17:341-353.

SolidWorks Corporation, SolidWorks 2008 What's New (1995-2007) Book.

Stockline, L.E., "Process Condition Monitoring," IEEE, Promess, Inc., Brighton, Michigan (1994) 57-62.

Venkatachalam et al., "A knowledge-based approach to design for manufacturability," J. Intell. Mfg. (1993) 4:355-366.

Vosniakos et al., "Knowledge-based automatic allocation of CAD drawing annotation to wireframe IGES models of 2 ½-D prismatic parts," Int. J. Adv. Manuf. Technol. (1990) 5:224-239.

Vosniakos, G., "An intelligent software system for the automatic generation of NC programs from wireframe models of 2-½D mechanical parts," Computer Integrated Manufacturing Systems (1998) 11(1-2):53-65.

Yu, J-C. et al., "Computer aided design for manufacturing process selection," J. Intelligent Mfg. (1993) 4:199-208.

Zha et al., "A web-based advisory system for process and material selection in concurrent product design for a manufacturing environment," Int. J. Adv. Manuf. Tech. (2005) 25:233-243.

Zhao, Z. et al., "Domain independent shell for DfM and its application to sheet metal forming and injection molding," Computer-Aided Design (2005) 37:881-898.

Zhou, X. et al., "A feasible approach to the integration of CAD and CAPP," Computer-Aided Design (2007) 39:324-338.

United States Patent Office Action for U.S. Appl. No. 12/247,828 dated Dec. 30, 2010 (33 pages).

United States Patent Office Action for U.S. Appl. No. 12/247,828 dated May 6, 2011 (11 pages).

United States Patent Office Interview Summary for U.S. Appl. No. 12/247,828 dated Apr. 1, 2011 (3 pages).

United States Patent Office Action for U.S. Appl. No. 12/247,837 dated Jan. 7, 2011 (33 pages).

United States Patent Office Interview Summary for U.S. Appl. No. 12/247,837 dated Mar. 31, 2011 (3 pages).

United States Patent Office Notice of Allowance for U.S. Appl. No. 12/247,837 dated May 9, 2011 (14 pages).

United States Patent Office Notice of Allowance for U.S. Appl. No. 12/247,837 dated Jul. 6, 2011 (4 pages).

United States Patent Office Action for U.S. Appl. No. 12/324,441 dated Jan. 6, 2011 (38 pages).

United States Patent Office Action for U.S. Appl. No. 12/324,441 dated Apr. 4, 2011 (3 pages).

United States Patent Notice of Allowance for U.S. Appl. No. 12/247,828 dated Sep. 20, 2011 (4 pages).

United States Patent Office Action for U.S. Appl. No. 12/247,842 dated Aug. 23, 2011 (20 pages).

United States Patent Office Action for U.S. Appl. No. 12/324,441 dated May 19, 2011 (8 pages).

| Material | Code | Commercial Tolerance +/- | | | Minimum Tolerance +/- | | |
|---|---|---|---|---|---|---|---|
| | | T1c inch | T2c inch | T3c inch | T1f inch | T2f inch | T3f inch |
| ABS-(Acrylonitrile Butadiene Styrene) | ABS | 0.0040 | 0.0120 | 0.0030 | 0.0020 | 0.0080 | 0.0020 |
| Acrylic | | 0.0040 | 0.0130 | 0.0040 | 0.0020 | 0.0080 | 0.0020 |
| Alkyd | Thermoset | 0.0040 | 0.0100 | 0.0020 | 0.0020 | 0.0070 | 0.0010 |
| Alkyd/Polyester (Glass fiber filled) | Thermoset | 0.0030 | 0.0050 | 0.0010 | 0.0020 | 0.0030 | 0.0010 |
| Cellulosics | | 0.0040 | 0.0110 | 0.0040 | 0.0020 | 0.0070 | 0.0020 |
| DAP-(Diallylphalate) | DAP | 0.0030 | 0.0060 | 0.0020 | 0.0020 | 0.0040 | 0.0010 |
| Epoxy (EP) | EP | 0.0040 | 0.0100 | 0.0020 | 0.0030 | 0.0080 | 0.0010 |
| High Density Polyethylene | HDPE | 0.0060 | 0.0208 | 0.0060 | 0.0050 | 0.0190 | 0.0030 |
| Low Density Polyethylene | LDPE | 0.0060 | 0.0200 | 0.0050 | 0.0030 | 0.0130 | 0.0030 |
| Melaine-Urea | MF-UF | 0.0040 | 0.0180 | 0.0030 | 0.0030 | 0.0110 | 0.0020 |
| Melaine-Phenolic | MF-PF | 0.0050 | 0.0100 | 0.0010 | 0.0040 | 0.0052 | 0.0010 |
| Polyamade (Nylon) | PA | 0.0030 | 0.0125 | 0.0030 | 0.0010 | 0.0090 | 0.0020 |
| Polyamide (Nylon) Zytel | PA | 0.0035 | 0.0130 | 0.0030 | 0.0015 | 0.0090 | 0.0020 |
| Polyamide (Nylon) Zytel Glass reinforced | PA | 0.0020 | 0.0120 | 0.0030 | 0.0010 | 0.0090 | 0.0020 |
| Polycarbonate | PC | 0.0030 | 0.0090 | 0.0020 | 0.0020 | 0.0060 | 0.0020 |
| Polyester (Valox) 300 family and 744 | PBT | 0.0035 | 0.0120 | 0.0030 | 0.0017 | 0.0073 | 0.0020 |
| Polyester (Valox) 325 and 310-SEO | PBT | 0.0030 | 0.0118 | 0.0030 | 0.0020 | 0.0068 | 0.0020 |
| Polyester (Valox) 400 family, 800 family, and 751 | PBT | 0.0020 | 0.0100 | 0.0030 | 0.0010 | 0.0065 | 0.0020 |
| Polyester (Valox) 500 family | PBT | 0.0020 | 0.0095 | 0.0030 | 0.0010 | 0.0060 | 0.0020 |
| Polyester (Valox) 700 family except 744 and 751 | PBT | 0.0020 | 0.0095 | 0.0030 | 0.0010 | 0.0060 | 0.0020 |
| Polyester (Valox) DR-51 and DR-48 | PBT | 0.0020 | 0.0100 | 0.0030 | 00.010 | 0.0065 | 0.0020 |
| Polyester (Reynite) Glass-reinforced | PET | 0.0020 | 0.0120 | 0.0020 | 0.0020 | 0.0060 | 0.0015 |
| Polyetherimide | PEI | 0.0010 | 0.0070 | 0.0010 | 0.0005 | 0.0030 | 0.0005 |
| Polyetherimide Ultem 1000 | PEI | 0.0020 | 0.0080 | 0.0035 | 0.0010 | 0.0060 | 0.0015 |
| Polyethylene-Terephthate (Polyester PET) | PETE | 0.0030 | 0.0110 | 0.0030 | 0.0020 | 0.0070 | 0.0020 |
| Phenol-Formaldehyde (Phenolic-Fiber filled) | PF | 0.0040 | 0.0150 | 0.0030 | 0.0030 | 0.0080 | 0.0020 |
| Phenol-Formaldehyde (Phenolic)General Purpose | PF | 0.0060 | 0.0120 | 0.0020 | 0.0030 | 0.0070 | 0.0010 |
| Phenol-Formaldehyde (Phenolic)Glass filled | PF | 0.0020 | 0.0033 | 0.0010 | 0.0010 | 0.0023 | 0.0010 |
| Polyoxymethylene (Acetal) | POM | 0.0040 | 0.0140 | 0.0040 | 0.0020 | 0.0080 | 0.0020 |
| Acetal Delrin | POM | 0.0020 | 0.0120 | 0.0020 | 0.0020 | 0.0078 | 0.0010 |
| Polypropylene | PP | 0.0050 | 0.0175 | 0.0050 | 0.0030 | 0.0110 | 0.0030 |
| Polyphenylene Ether | PPE | 0.001 | 0.0078 | 0.001 | 0.0005 | 0.0025 | 0.0005 |
| Polyphenylene Oxide | PPO | 0.001 | 0.0078 | 0.001 | 0.0005 | 0.0025 | 0.0005 |
| Polystyrene | PS | 0.0030 | 0.0120 | 0.0040 | 0.0020 | 0.0070 | 0.0020 |
| Polyvinyl Chloride (Vinyl-Flexible) | PVC | 0.0100 | 0.0190 | 0.0050 | 0.0060 | 0.0140 | 0.0030 |
| Polyvinyl Chloride (Vinyl-rigid) | PVC | 0.0070 | 0.0148 | 0.0050 | 0.0038 | 0.0090 | 0.0030 |
| Styrene-Acrylonitrile | SAN | 0.002 | 0.009 | 0.002 | 0.001 | 0.008 | 0.0015 |
| Thermoplastic Polyester | TPPE | 0.003 | 0.01 | 0.0015 | 0.0015 | 0.006 | 0.001 |
| Teflon-FEP | FEP | 0.002 | 0.008 | 0.002 | 0.002 | 0.012 | 0.001 |
| Teflon-PFA | PFA | 0.002 | 0.008 | 0.002 | 0.002 | 0.012 | 0.001 |

Fig.12

SYSTEMS, METHODS, AND TOOLS FOR PROOFING A COMPUTER-AIDED DESIGN OBJECT

RELATED APPLICATION

This application is a continuation of U.S. patent application Ser. No. 12/247,837, filed Oct. 8, 2008, which is incorporated herein by reference in its entirety.

FIELD OF THE INVENTION

Embodiments of the invention relate to systems, methods, and tools for proofing a computer-aided design (CAD) object. More specifically, embodiments of the invention are directed to systems, methods, and tools for proofing aspects of a CAD object, such as a CAD drawing or a CAD model, representing an apparatus.

BACKGROUND

Computer-aided design (CAD) objects, such as CAD drawings or CAD models, have become increasingly popular due to the expanded capabilities and sophisticated controls of available CAD software applications. CAD applications are sometimes implemented to produce drawings and/or models that are used by manufacturing companies to build manufactured components. Some CAD applications have the capability to apply or embed geometric dimensioning and tolerances ("GD&T") to or in a CAD drawing. GD&T is an international language that includes a set of definitions applied to elements of the CAD drawing. GD&T provides a user with functional dimensioning of the product or component illustrated in the CAD drawing. CAD objects also include other important information such as notes regarding the drawing and/or the apparatus of the drawing. Some CAD applications also generate a computer-created model based on the CAD drawing or vice-versa.

SUMMARY

The manufacturability of an apparatus (e.g., component, part, etc.) can depend on many factors such as materials, process types, standards, good design practices, and the like. For example, while a CAD object may include proper dimensioning, if entered tolerances of the apparatus are less than a set of defined tolerances or rules for a material and/or process, the apparatus may be considered non-manufacturable. As another example, if the notes for the drawing do not convey the necessary information to manufacture the apparatus, the apparatus may be considered non-manufacturable.

The manufacturability of the apparatus can also depend on an analysis of the computer-implemented model. For example, while the GD&T of the drawing meets proper rules, if locations and features of size of the CAD object do not satisfy defined dimensions or rules, the apparatus may be considered non-manufacturable. The invention provides a system, method, and tool for proofing the CAD object to determine whether the object has deficiencies.

In one embodiment, the invention provides a casting tolerance proofing tool adapted to be implemented with a computer system. The computer system has a processor and a memory storing a CAD object of an apparatus to be manufactured with a casting process. The proofing tool includes a criteria selector operable to prompt for and receive a type of casting process for the apparatus to be manufactured with, and an extractor operable to determine a nominal dimension and a related tolerance from the CAD object. The proofing tool also includes a rule module operable to obtain a first data value from the memory, the first obtained data value being based on the specified type of casting process, obtain a second data value from the memory, the second obtained data value being based on the specified type of casting process, obtain a function having a variable, determine a first threshold based on the function, the first obtained data value and the nominal dimension, the first threshold corresponding to a commercial tolerance threshold, and determine a second threshold based on the function, the second obtained data value, and the nominal dimension, the second threshold corresponding to a minimum tolerance threshold. The proofing tool further includes a comparator operable to compare the tolerance with the first threshold and the second threshold, and a tagging module operable to tag the CAD object based on the comparisons.

In another embodiment, the invention provides a method of proofing a design for an apparatus. The method is performed with a computer system having a processor and memory. The he method includes receiving a CAD object of the apparatus; prompting for a type of manufacturing process for the apparatus to be manufactured with; receiving a response specifying the type of manufacturing process; determining a nominal dimension and a related tolerance from the CAD object; obtaining a first data value from the memory, the first obtained data value being based on the specified type of manufacturing process; obtaining a second data value from the memory, the second obtained data value being based on the specified type of manufacturing process; obtaining a function having a variable; determining a first threshold based on the function, the first obtained data value, and the nominal dimension; determining a second threshold based on the function, the second obtained data value, and the nominal dimension, the second threshold corresponding to a minimum tolerance threshold; comparing the tolerance with the threshold; comparing the tolerance with the second threshold; and tagging the CAD object based on the comparisons.

In another embodiment, the invention provides a manufacturing tolerance proofing tool adapted to be implemented with a computer system. The computer system has a processor and a memory storing a CAD object of an apparatus to be manufactured with a process. The tool includes a criteria selector operable to prompt for and receive a type of a manufacturing process for the apparatus to be manufactured with, and an extractor operable to determine a nominal dimension and a related tolerance from the CAD object. The tool also includes a rule module operable to obtain a first data value from the memory, the first obtained data value being based on the specified type of manufacturing process, obtain a second data value from the memory, the second obtained data value being based on the specified type of manufacturing process, obtain a function having a variable, determine a first threshold based on the function, the first obtained data value and the nominal dimension, determine a second threshold based on the function, the second obtained data value, and the nominal dimension, the second threshold corresponding to a minimum tolerance threshold. The tool further includes a comparator operable to compare the tolerance with the first threshold and the second threshold, and a tagging module operable to tag the CAD object based on the comparisons.

Other aspects of the invention will become apparent by consideration of the detailed description and accompanying drawings.

BRIEF DESCRIPTION OF THE DRAWINGS

FIG. 12 is a table listing a plurality of definitions for the plastic tolerance proofing tool.

DETAILED DESCRIPTION

Figure 1:
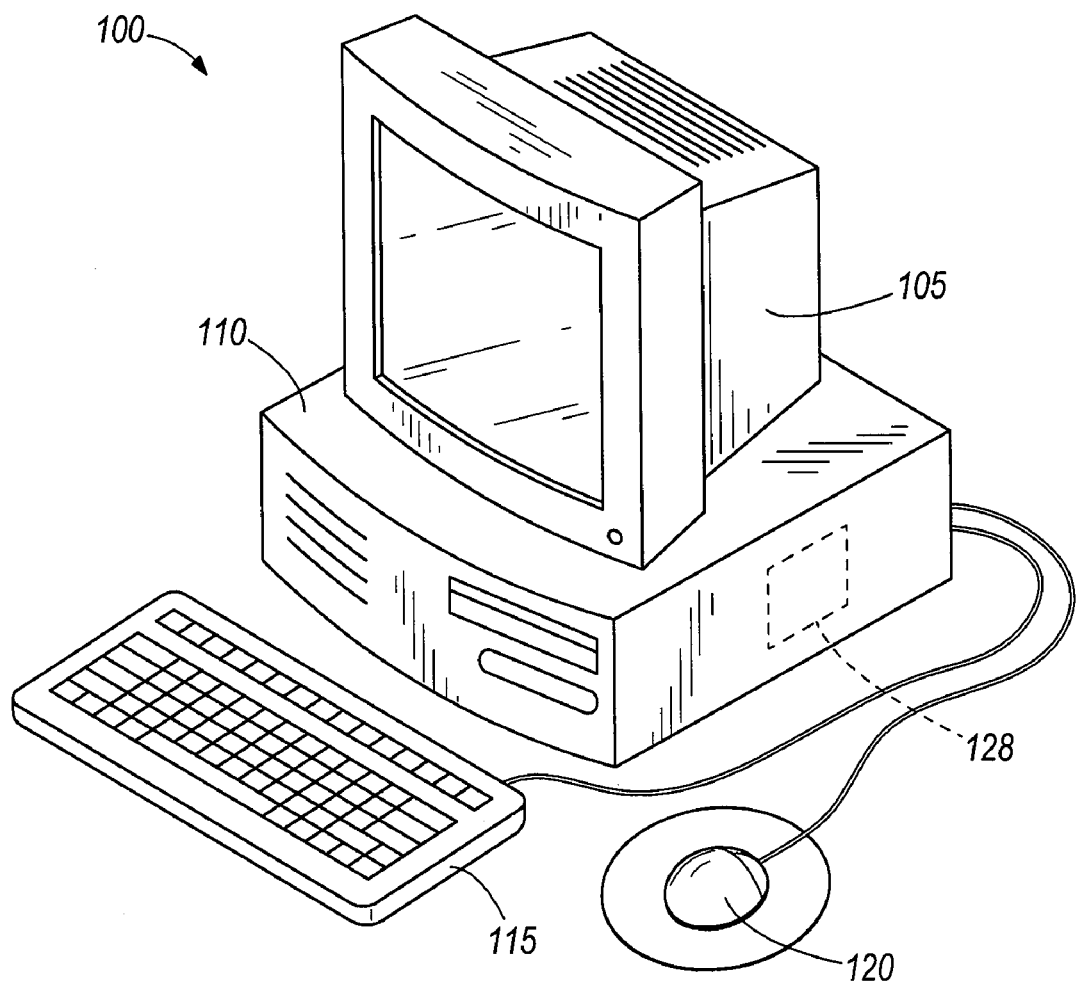
FIG. 1 illustrates an exemplary computer system according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

The use of "including," "comprising," or "having" and variations thereof herein is meant to encompass the items listed thereafter and equivalents thereof as well as additional items. The use of "mounted," "connected," "supported," and "coupled" and variations thereof herein encompass both direct and indirect mountings, connections, supports, and couplings. Further, "connected" and "coupled" are not restricted to physical or mechanical connections or couplings.

As should also be apparent to one of ordinary skill in the art, the systems shown in the figures are models of what actual systems might be like. As noted, many of the modules and logical structures described are capable of being implemented in software executed by a microprocessor or a similar device or of being implemented in hardware using a variety of components including, for example, application specific integrated circuits ("ASICs"). Terms like "processor," "module," and "tool" may include or refer to both hardware and/or software. In addition, capitalized terms and acronyms are used. Such terms are used to conform to common practices and to help correlate the description with the examples described and the drawings. However, no specific meaning is implied or should be inferred simply due to the use of capitalization.

The term "illegal" (and variants thereof) is used herein to describe certain aspects of embodiments of the invention. The term "illegal" is used to broadly describe elements and/or actions that are not allowed, or that lead to invalid results, as should be apparent to one of ordinary skill in the art. The use is not a special one, but one that is consistent with the general definition of the term.

Before describing embodiments of the invention, a brief review of CAD software applications that include GD&T functionality is provided. Nonetheless, it is assumed that the reader is familiar with GD&T specifications.

Some CAD software applications (e.g., Unigraphics, CATIA, etc.) allow a user to apply GD&T to CAD objects. For example, GD&T rules, which may be indicated in the drawing using one or more GD&T symbols, are applied to the apparatus being drafted in the CAD object. The GD&T rules define the physical dimensions and tolerances of the apparatus. As such, a user can create an accurate apparatus by following the GD&T symbols applied in the CAD object. Additionally, an apparatus that has been produced can be inspected (e.g., verified to determine whether the component has been produced according to the specification set forth in the drawing model) by comparing the produced component to the CAD object.

In general, CAD objects that include GD&T also include other standard symbols and information such as notes and dimensional values, which are often displayed in a standardized manner. For example, as should be recognized by those skilled in the art, basic dimensions are numerical values that represent a theoretical exact size, true profile, orientation, or location of a feature. Generally, basic dimensions are specified by enclosing a single numerical value in a box. Alternatively, dimensions with tolerances provide a range of acceptable dimensional values. A drawing note conveys additional information to a reader of the CAD object (e.g., the manufacturer, draftsman, technician, etc.) that is not specified in the object. That is, a drawing note is general to the CAD object.

As used herein, a CAD object is a general term that can include a CAD drawing, a CAD-implemented model, and similar CAD items. A CAD drawing may be created from a CAD-implemented model or vice-versa. As known in the art, the CAD-object can be maintained as a computer file, a data block, etc. It should also be understood, that when using the term "drawing" or "model", the terms are meant to be generic to CAD objects. For example, the term "drawing notes" is not meant to be limited to just CAD drawings, but rather is generic to any CAD object.

FIG. 1 illustrates an exemplary computer system 100. The computer system 100 is used, in some constructions, to create a CAD object with a CAD software application and to proof at least one or more aspects in the object. The exemplary computer system 100 is a computer that includes components such as a monitor 105, a housing 110, a keyboard 115, and a mouse 120. It should be apparent to those skilled in the art that the hardware housing 110 may contain components such as one or more processors, random access memory, read only memory, storage devices (e.g., hard drives, CD-ROM disk drives, etc.), and the like. The random access memory, read only memory, storage devices, and related memory devices are collectively referred to herein as memory 128. It should also be understood that the shown computer can be a client or peer computer in a client-server or peer system and that the computer system 100 includes the master or second computer with its processor(s) and memory. Additionally, software applications executed by the hardware can be used to produce CAD images on the monitor 105. The images can be manipulated by user input devices such as the keyboard 115 and the mouse 120.

After a user or a CAD operator has created or recalled a CAD object with the CAD software, the operator initiates a proofing (or verification) tool that proofs the adequacy of the CAD object and/or verifies a manufacturability of the apparatus represented in the CAD object. For example, the proofing tool can implement a process that identifies whether GD&T has been applied to a drawing incorrectly or illegally. Exemplary tools and processes for GD&T proofing are described in U.S. patent application Ser. No. 11/536,075, filed on 28 Sep. 2006, the entire content of which is incorporated herein by reference. For another example, the proofing tool can implement a process that determines whether tolerances on a drawing satisfy rules based on criteria entered by an operator. For yet another example, the proofing tool can implement a process to analyze a CAD object for validating whether an apparatus can be manufactured. For a further example, the proofing tool can implement a process to analyze whether the operator has entered notes that satisfy a library of rules, some of the rules being based on criteria entered by an operator.

Figure 2:
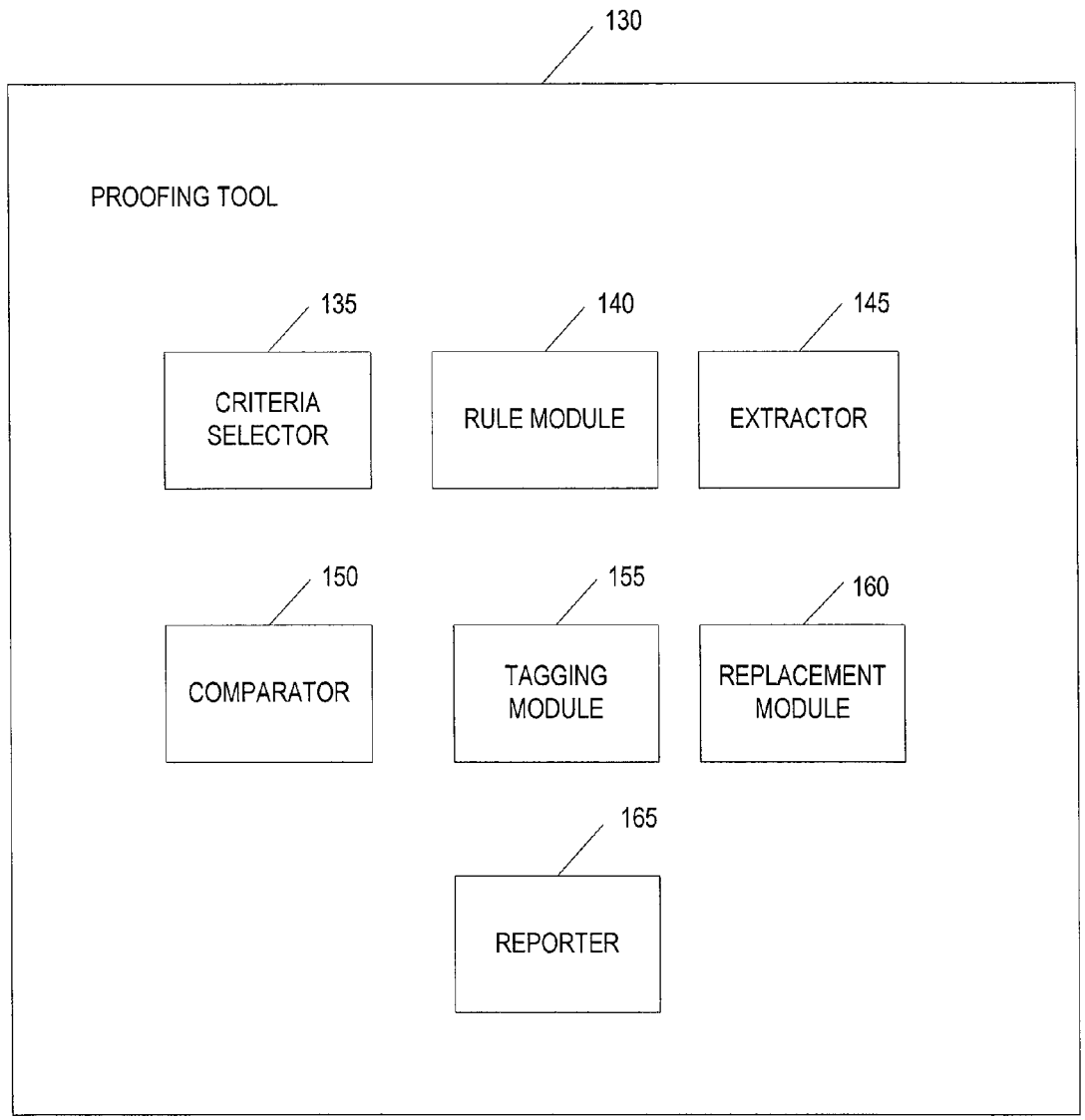
FIG. 2 illustrates a proofing tool capable of being implemented with the computer system of FIG. 1.

FIG. 2 illustrates an exemplary proofing tool 130 for use with the CAD system 100. In some constructions, the proofing tool 130 is implemented as stand-alone software. In other constructions, the proofing tool 130 is an add-on computer application to work in conjunction with the CAD software application. The proofing tool 130 includes a criteria selector 135 allowing an operator to interactively enter one or more pieces of criterion for the tool. Example criteria include a material for the apparatus, a production process or technique for manufacturing the apparatus, a manufacturer of the apparatus, an entity performing or requesting the validation, an end entity for the apparatus, a country the apparatus will be delivered to, a standard the apparatus is to be manufactured under, a standard the apparatus is to meet, etc.

The tool 130 includes a rule module 140 having information, such as tables, functions, text, processes, libraries, etc, which collectively form, or are a part of, rules. Example rules include a function that defines a tolerance not to be exceeded, a preferred wording for a type of note, a type of note that should be reviewed by an operator, etc. The rules are determined (e.g., selected or created) based on the entered criteria. The rules can be based on other factors such as the selected tool 130.

An extractor 145 reads or retrieves items of interest from the CAD object. Example items of interest include GD&T, dimension tolerances, location dimensions, feature-of-size dimensions, and notes. The selected items of interest may be based on the selected tool 130 and/or the entered criteria from the user.

A comparator 150 compares extracted items of interest (which may be modified) with a comparison value or item, the comparison being based on a rule. A tagging module 155 tags (e.g., flags, attaches a result) to the extracted item and/or the rule based on the result from the comparison module. In some constructions, the tag indicates a non-manufacturable instance or a manufacturable instance. A replacement module 160 determines a replacement item for a flagged item of interest. The replacement item is an item for replacing, typically, a non-manufacturable item of interest. In a preferred construction, the replacement item is suggested to the user and the user agrees to the replacement before the non-manufacturable item is exchanged with the replacement item. But it is envisioned that the replacement module can automatically revise the CAD object with the replacement item without approval from an operator.

The tool 130 also includes a reporter 165 for generating a report that is based on the results of the proofing. The report includes tagged (e.g., flagged) items and can include the replacement items. It is also envisioned that a set of guidelines or definitions can be included with the flagged or replacement items.

Figure 3:
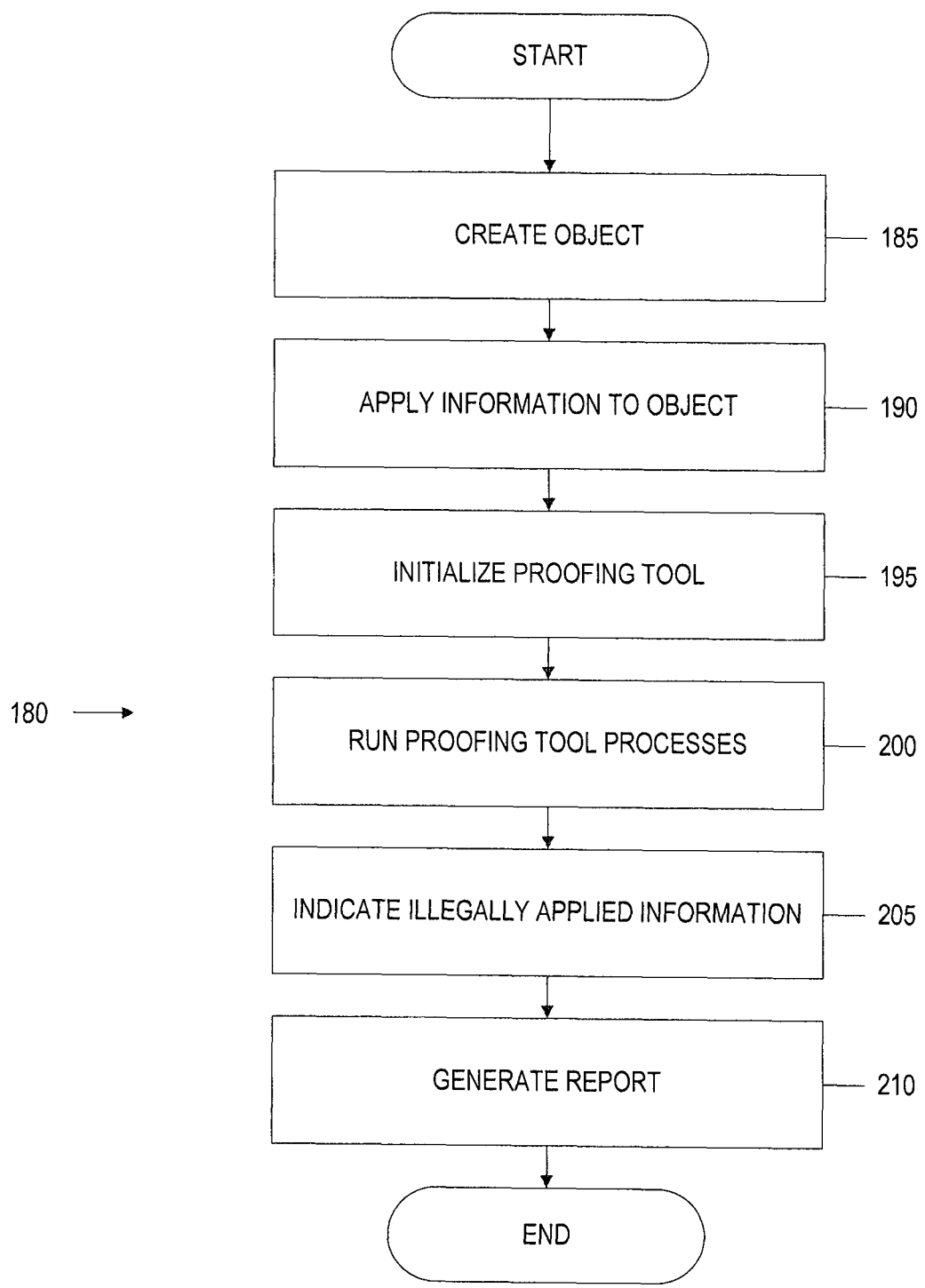
FIG. 3 illustrates an exemplary proofing process for use by the system in FIG. 1.

FIG. 3 illustrates an exemplary proofing process 180 that proofs/validates information (e.g., dimension tolerances, location dimensions, feature-of-size dimensions, notes, etc.) from a CAD object. As described below, there are numerous reasons that rules applied to a drawing result in items of interest as being illegal. In some implementations, an item of interest is identified as illegal if a rule is applied to a drawing component in an impossible or nonsensical manner. In other implementations, an item of interest is identified as illegal if the rule is technically applied correctly, but is not applied according to common or "good practice" standards.

The process 180 begins by creating a CAD object (step 185). The CAD object can be created, for example, using a CAD software application (such as Unigraphics) and the computer 100 shown in FIG. 1. After and/or while the CAD object is being created, information (GD&T, dimensions, dimension tolerances, notes, etc.) is applied to the CAD object (step 190). In some implementations, a 3-D modeled apparatus can include multiple 2-D drawing views that correspond to the same apparatus (e.g., a top view, a front view, an isometric view, etc.). As such, information that is applied to one 2-D drawing view should also be logical in other views for a given component.

After completing the CAD object and applying information (steps 185 and 190 respectively), a proofing tool 130 is initialized (step 195). As discussed, the proofing tool 130, in some implementations, is a knowledge-based software tool that is added onto (or integrated into) the CAD software platform (e.g., Unigraphics). As such, it should be appreciated that the proofing tool 130 is capable of being applied to many different CAD software platforms, and is not limited to any one platform. In some implementations, the proofing tool 130 is initialized by an operator while operating the CAD software application. For example, an operator chooses to initialize the proofing tool 130 by selecting a proofing tool icon or other user-selectable item (e.g., an item in a proofing tool pull-down menu) while constructing a CAD object. In other implementations, the proofing tool 130 is automatically initialized, for example, prior to saving the CAD object. Other ways of initializing the proofing tool 130 are also possible. For example, in alternative constructions, the proofing tool 130 is a software application that is separate from the CAD software. In such constructions, the proofing tool 130 validates a previously saved CAD object by initializing the proofing tool 130 and selecting a saved CAD object.

After initializing the proofing tool 130 (step 195), the proofing tool 130 completes a plurality of proofing/validation processes (step 200). The proofing tool processes are used to indicate information that is improperly or illegally applied (described below). Sample processes are discussed in U.S. patent application Ser. No. 11/536,075. Other exemplary processes are discussed herein. As such, the proofing tool 130 need not complete all of the processes each time the proofing tool 130 is run. Additionally, the proofing tool 130 may include alternative processes (or steps within the processes) that are not specifically described herein.

Upon completion of the proofing tool processes (step 200), illegally applied information is identified in the CAD object (step 205). As described in greater detail below, illegally applied information can be identified in a variety of manners and can include information that is legal once confirmed by the user. In addition to indicating the illegally applied information in the CAD object, a proofing tool report is created (step 210). The report includes, for example, information regarding each illegal application.

Figure 4:
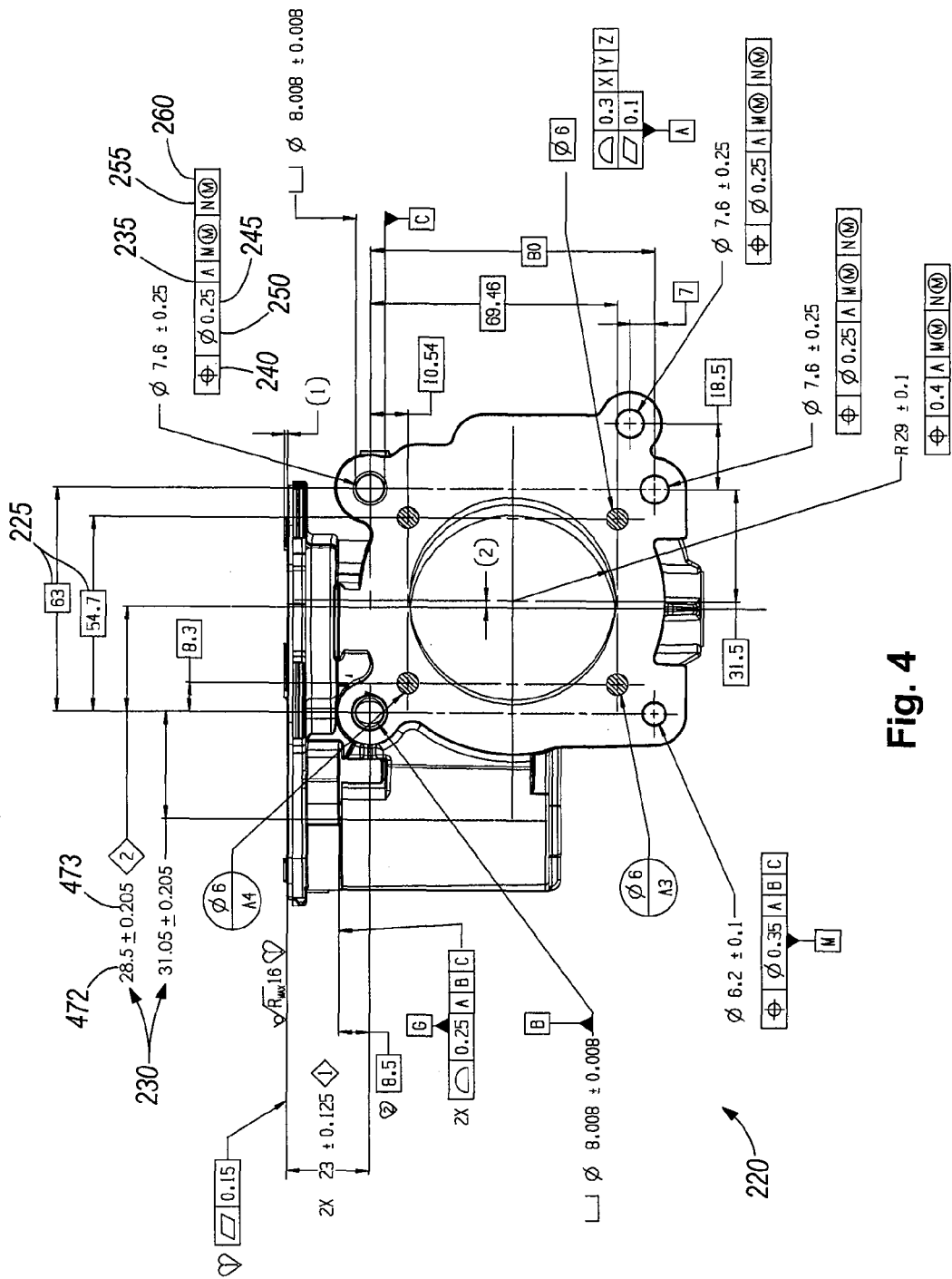
FIG. 4 illustrates an exemplary view of a CAD drawing created with the system in FIG. 1.

FIG. 4 illustrates an exemplary 2-D CAD drawing 220. While a CAD drawing can include multiple views, the drawing shown in FIG. 4 shows only one view. The drawing 220 can be created, for example, during step 185 of the process 180 (FIG. 2). The drawing 220 generally includes basic dimensions 225, as well as dimensions with tolerances 230. The dimensions included in the CAD drawing 220 are not necessarily representative of an actual component, and are included for illustrative purposes only. The drawing 220 also includes multiple feature control frames 235, which are divided into compartments containing a characteristic symbol 240 (e.g., straightness, flatness, circularity, profile of line, profile of surface, runout, position, etc.) followed by a tolerance value 245. In some constructions, the tolerance value 245 follows a diameter symbol 250 and/or precedes a datum reference 255 and/or proceeds tolerance or datum modifiers 260. Additionally, in some implementations, control frames are associated with datum features. The CAD drawing 120 can include notes that are typically located in a legend.

The CAD software, in some exemplary constructions, models the 2-D CAD drawing to result in a 3-D CAD-implemented model of the apparatus. In other constructions, the CAD software partitions the 3-D CAD-implemented model to result in 2-D CAD drawings. The completed CAD drawing 220 and/or the CAD model can be checked for invalid or illegal applications of information using one or more processes.

Figure 5:
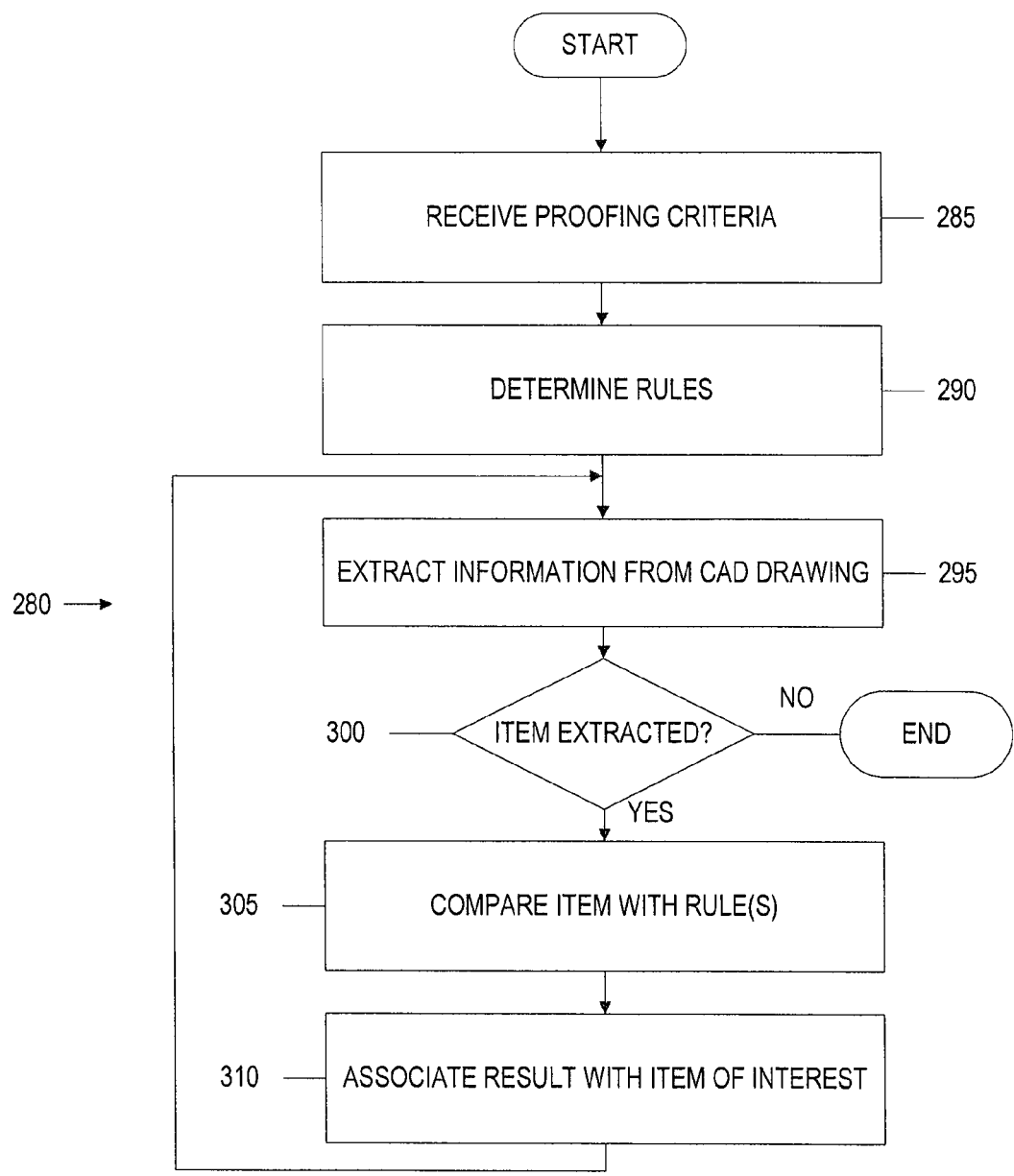
FIG. 5 illustrates a process that further defines one or more steps of the process in FIG. 3.

FIG. 5 is an exemplary process 280 that further defines an implementation of a portion of the process 180 of FIG. 3. Prior to step 200, typically part of step 195, the operator selects a proofing tool 130 for proofing the CAD object. For example, the proofing tool 130 can be the GD&T validation tool discussed in U.S. patent application Ser. No. 11/536,075. Alternative proofing tools include a tolerance proofing tool, a stamped metal proofing tool, and a note proofing tool.

With reference to FIG. 5, an operator enters and the proofing tool 130 receives proofing criteria (step 285). The proofing criteria are used by the tool 130 to determine the type of information to be proofed/validated in the CAD drawing. The type of proofed information can be, for example, GD&T, dimensions (e.g., location or feature-of-size dimensions), dimension tolerances, and notes. Example criteria can include a material for the apparatus in the CAD drawing and/or a production process or technique for the apparatus. Other possible criteria include a manufacturer of the apparatus, an entity performing or requesting the proofing, an end entity for the apparatus, a country the apparatus will be delivered to, a standard the apparatus is to be manufactured under, a standard the apparatus must satisfy, etc.

At step 290, the proofing tool 130 determines one or more rules based on the selected criteria and/or the selected proofing tool 130. The rules can provide conditions the items of interest must follow or meet, guidelines the items of interest should follow or meet, or characteristics in the items of interest that are to be identified. The specific examples of proofing tools below provide exemplary rules. In one example, the rules include a function that creates a comparison value (e.g., a threshold) for comparing with a dimension or tolerance from a CAD object. In another specific example, the rules include a preferred wording for a type of note. In yet another example, the rules include a type of note that should be identified for the operator to review before finalizing the drawing. Other specific examples are provided.

The tool then begins a process to extract information (step 295) from the CAD drawing based on the selected criteria. As used herein, the term "based on" and variations thereof define a base or basis upon which a specified determination is based. However, other determinations can be included with the recited determination. For example, the proofing tool 130 can extract information from the CAD object based on the selected criteria and further based on the selected proofing tool 130. Other or additional basis for selecting the extracted information are possible.

When extracting information from the CAD object, an extracted piece of information is referred to herein as an item of interest. The extracting of information can be by various techniques such as selecting or acquiring an item of interest (e.g., such as a location dimension) or calculating an item of interest (such as a dimension for a feature of size) from one or more pieces of information. Specific examples of items of interest are provided below with the exemplary proofing tools 130.

After obtaining an item of interest (step 300), the proofing tool 130 compares the item with one or more rules (step 305). For example, the comparator 150 determines whether the item of interest follows (e.g., passes or satisfies) the rule. In another example, the comparator 150 determines whether the item of interest should be identified because the item of interest does (or does not) include a characteristic identified by the rule. Other specific examples are provided below and not discussed at this time.

It should be apparent to someone skilled in the art, that if the comparison is for multiple rules, then the comparison may be in a loop. The loop allows the item of interest to be compared to a rule one at a time until the process is complete. It should also be understood that the rules may vary depending on the item of interest. For example, if the item of interest is a first item type, then the item is compared to a first rule or set of rules. If the item of interest is a second item type, then the item is compared to a second rule or set of rules.

Based on the comparison, the proofing tool 130 associates a result with the item of interest (step 310). The result can be that the item of interest passed a rule, the item of interest passed all of the rules, or similar results. The results are identified on the CAD object (e.g., the CAD drawing, the computer-implemented model) and/or in a report. In some implementations, multiple results can be associated with the item of interest. The tool then returns to step 295 where the tool determines whether the CAD drawing and/or the model includes another item of interest.

Before proceeding further, it should be understood that the order of steps shown in FIG. 5 or other processes discussed herein could vary. Further, additional steps can be added to the process, not all of the steps may be required in the process, and one or more steps may be repeated within the process. This will become more apparent in the more detailed examples below.

Figure 6:
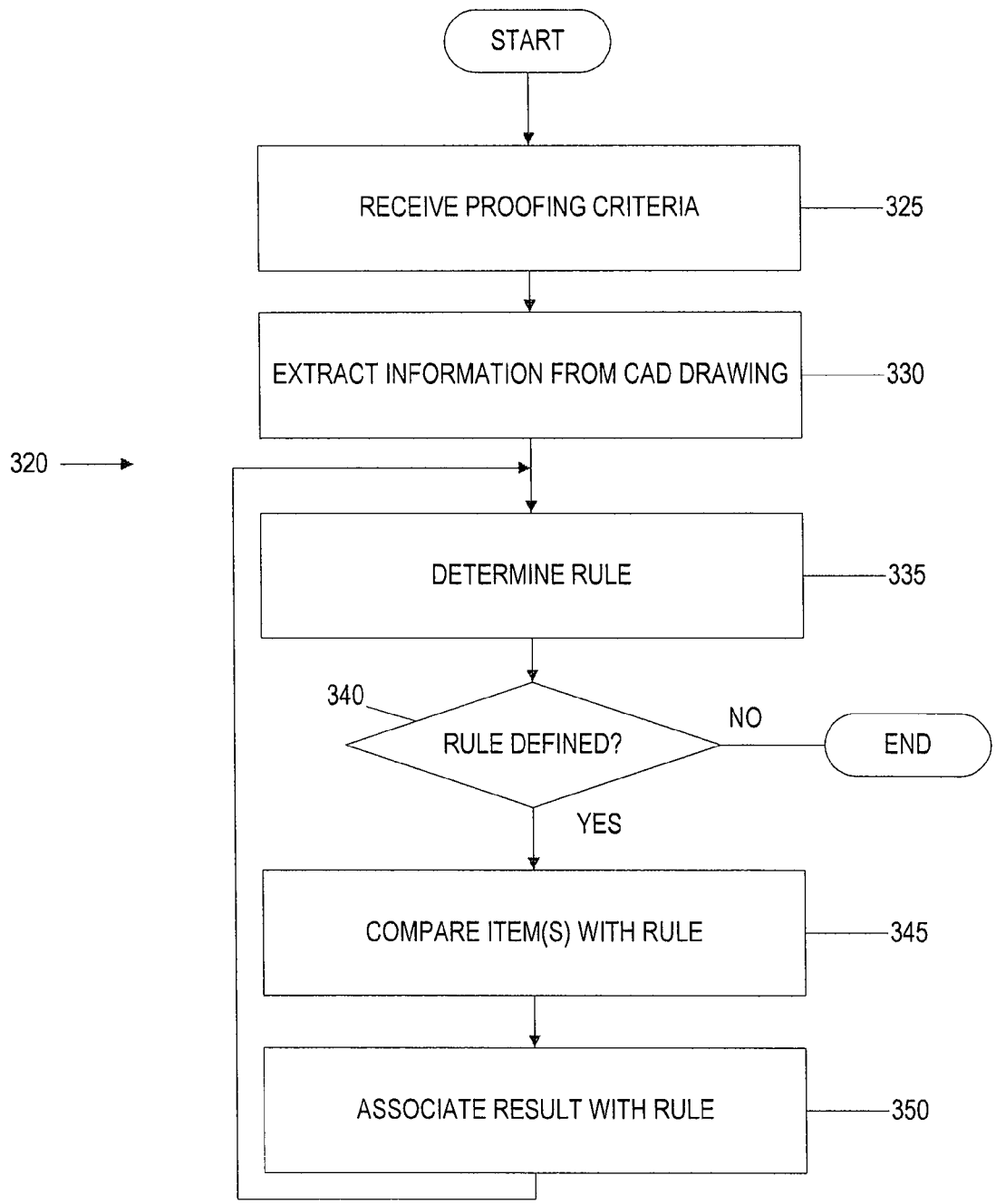
FIG. 6 illustrates another process that further defines one or more steps of the process in FIG. 3.

The process 320 shown in FIG. 6 is another process that further defines an implementation of a portion of the process 180 of FIG. 3. Prior to the process shown in FIG. 6, the operator selects a proofing tool 130 for proofing the CAD object. At step 325, an operator enters and the proofing tool 130 receives proofing criteria. Based on the criteria and/or the selected proofing tool 130, the tool 130 extracts the items of interest (step 330) for the comparison process. It should be apparent to someone skilled in the art that the extraction of the items of interest may be in a logical loop. The proofing tool 130 then begins a process to compare rules to the extracted item(s) of interest. The proofing tool 130 obtains a rule (step 335) based on the selected criteria and/or the selected tool 130. After obtaining a rule (step 340), the proofing tool 130 compares one or more of the items to the rule (step 345). After analyzing the item(s) of interest against the rule, a result is associated with the rule (step 350). In some implementations, multiple results can be associated with the rule. The proofing tool 130 then returns to step 335 where the proofing tool 130 determines whether another rule needs to be analyzed.

Having described FIGS. 5 and 6, which provide more detailed processes for portions of the process 180 of FIG. 4, the following description discloses processes for exemplary proofing tools. Another specific proofing tool is shown in FIGS. 4-14 of U.S. patent application Ser. No. 11/536,075.

For the exemplary proofing tools herein, when the tool performs a function or process, a processor retrieves one or more instructions from memory, interprets the retrieved instructions, and executes the interpreted instructions to perform the particular function or process. Other tools can perform differently.

Plastic Tolerance Proofing Tool

Figure 7:
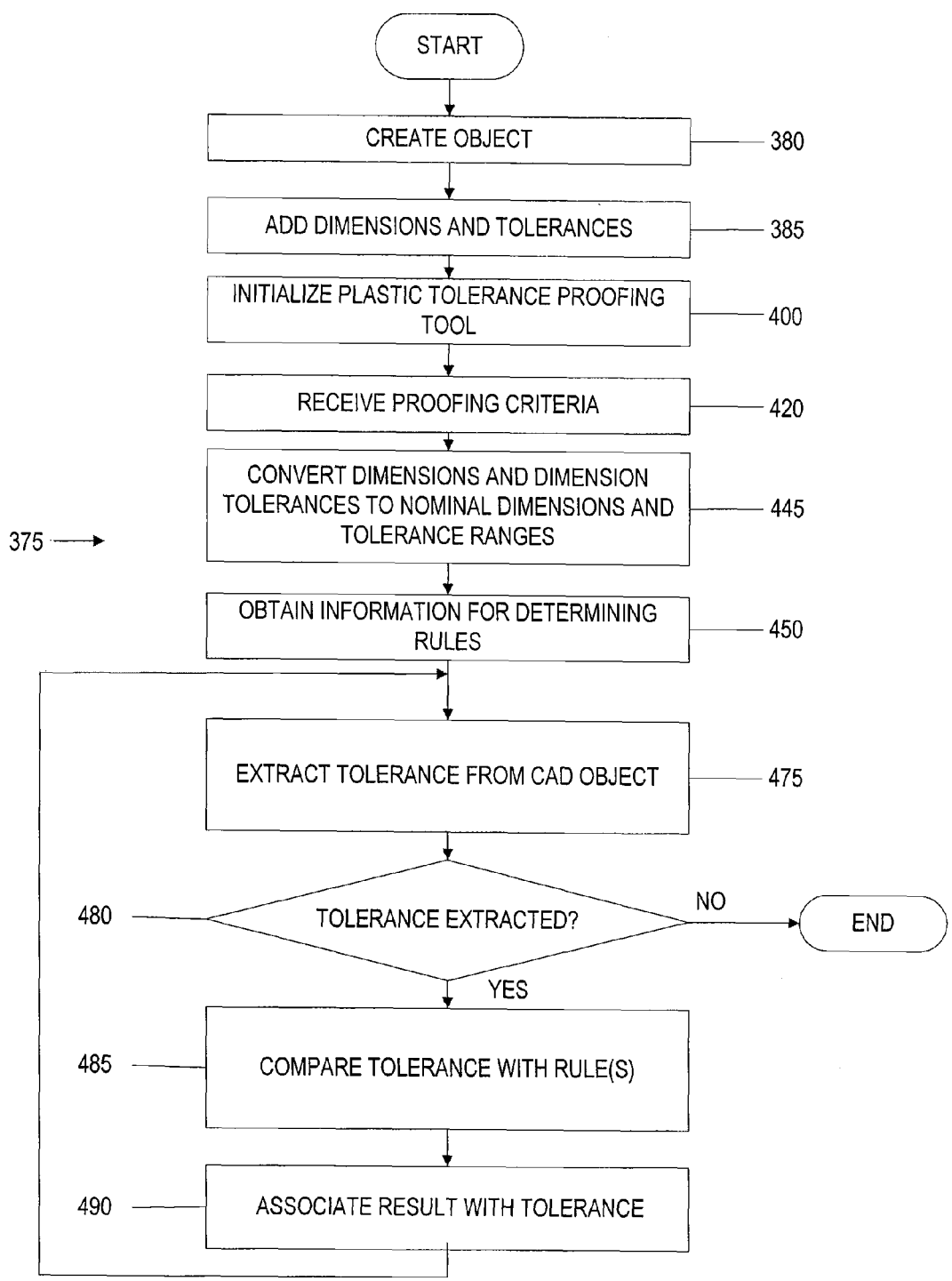
FIG. 7 illustrates an exemplary process for a plastic tolerance proof.
Figure 8:
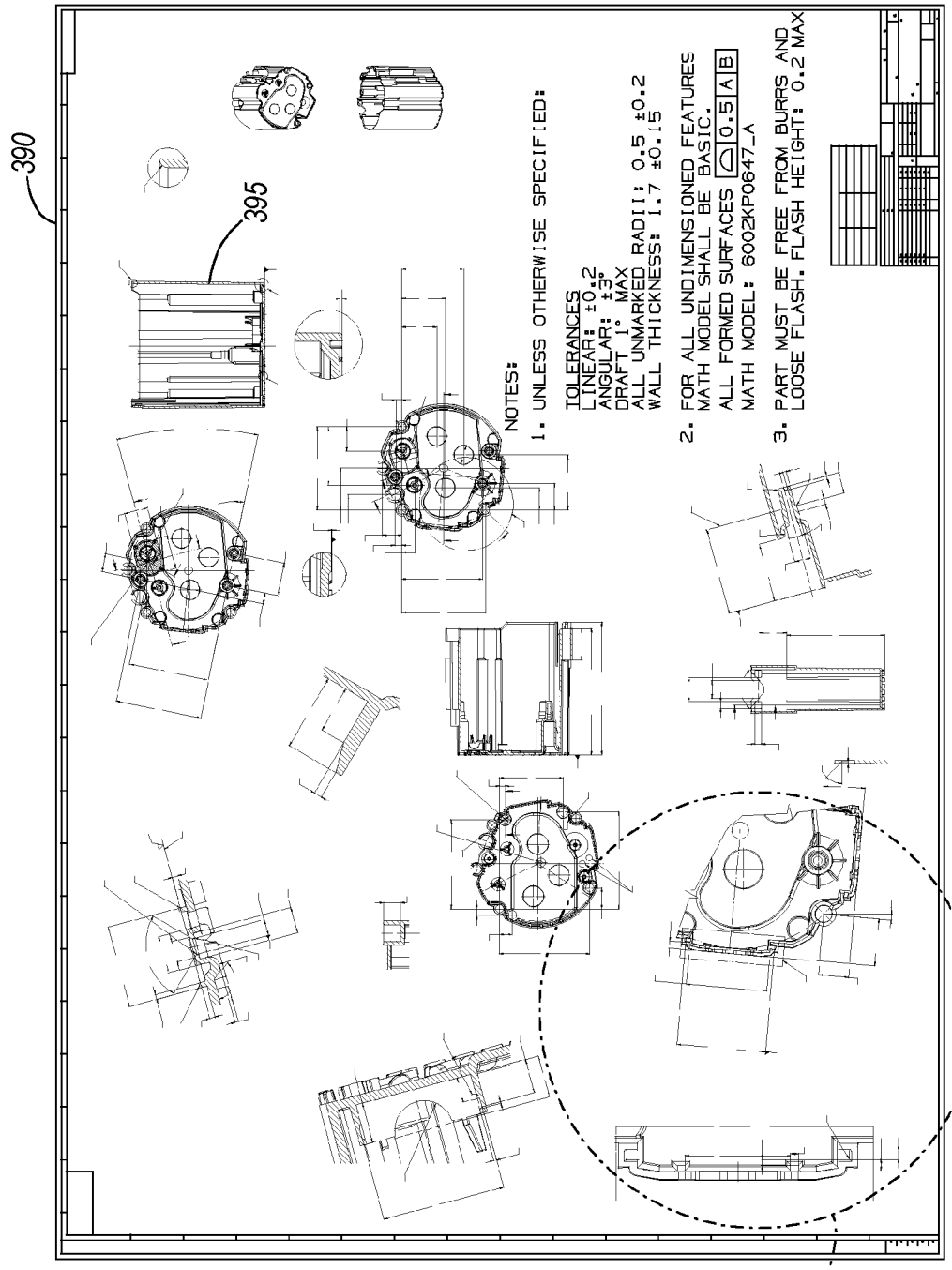
FIG. 8 illustrates a CAD drawing created with the system in FIG. 1.
Figure 9:
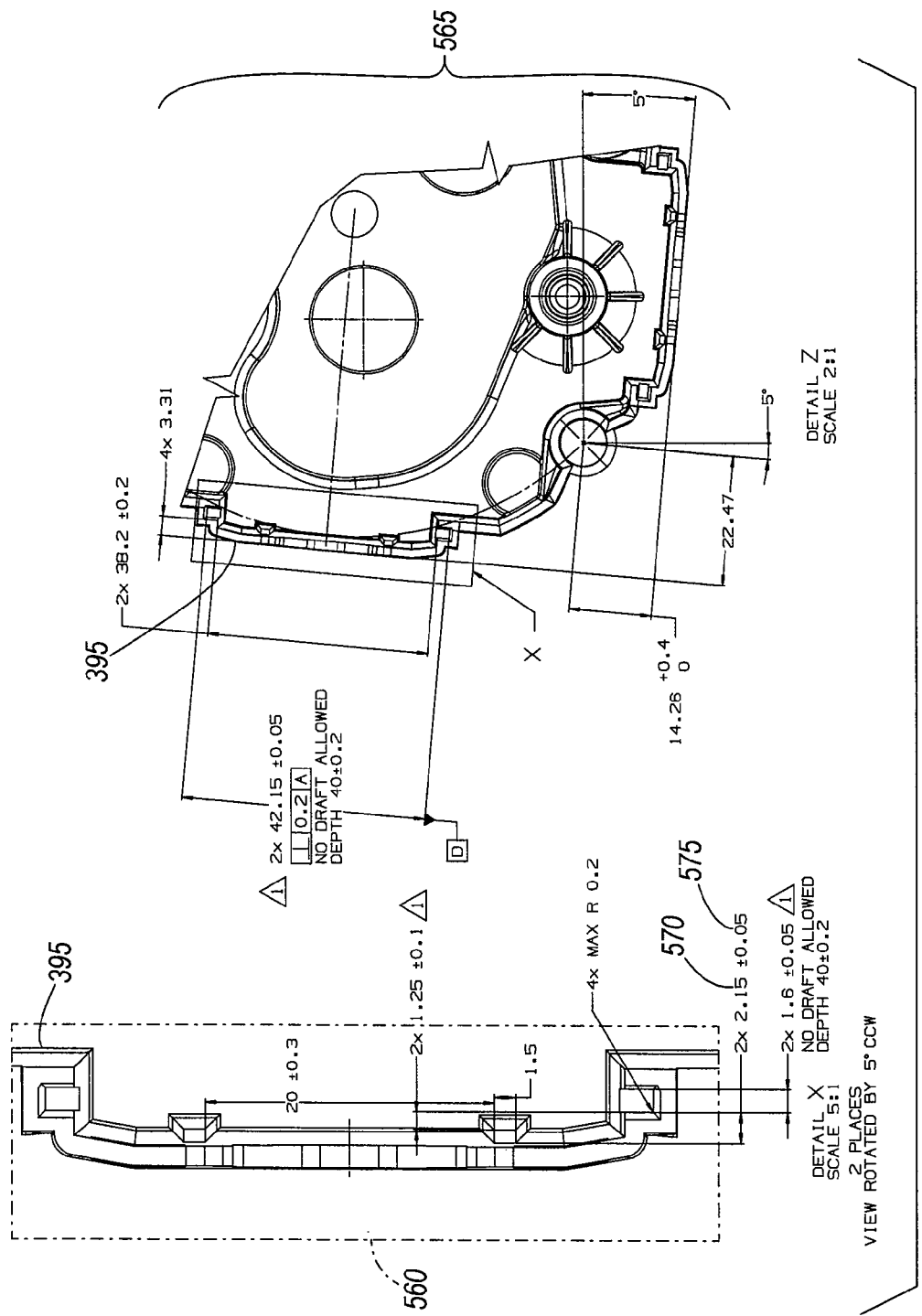
FIG. 9 illustrates a portion of the CAD drawing of FIG. 8.
Figure 10:
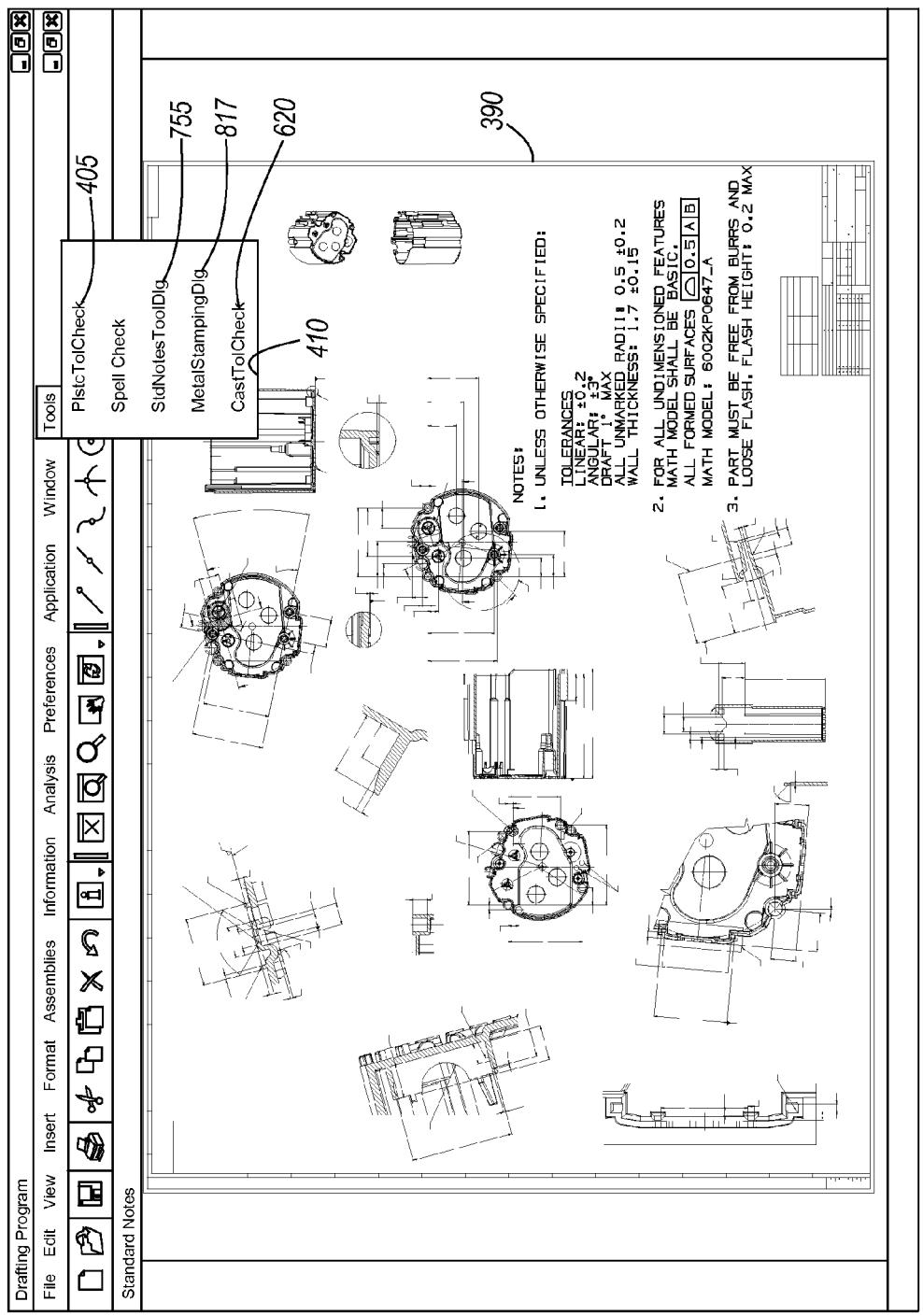
FIG. 10 illustrates a pull-down menu for initiating various proofing tools.

FIG. 7 discloses a process 375 for performing a plastic tolerance proof. The process 375 begins by creating a CAD object (step 380). The CAD object can be created, for example, using a CAD software application and the computer 100 shown in FIG. 1. After and/or while the CAD object is being created, dimensions and dimension tolerances are applied to the CAD object (step 385). FIG. 8 shows an exemplary CAD drawing 390 of an apparatus 395 having multiple drawing views (e.g., a top view, a front view, an isometric view, etc.) that correspond to the same apparatus 395. The GD&T for the exemplary CAD drawing 390 have been removed from FIG. 8 because the specific values are inconsequential for the invention herein. However, one skilled in the art would understand that the CAD drawing 390 shown in FIG. 8 and FIGS. 10, 11, and 17 (discussed below) would include GD&T. FIG. 9 shows a portion of the CAD drawing of FIG. 8. After completing the CAD drawing and applying information, the plastic tolerance proofing tool is initialized (step 400; FIG. 7). In the shown implementation, the proofing tool is a knowledge-based software tool that is added onto (or integrated into) a CAD software platform (e.g., Unigraphics). The plastic tolerance proofing tool is initialized by a user while operating the CAD software application. The user chooses to initialize the plastic tolerance proofing tool by selecting "PlstcTolCheck" 405 (FIG. 10) in a proofing tool pull-down menu 410 while constructing the CAD drawing 390.

Figure 11:
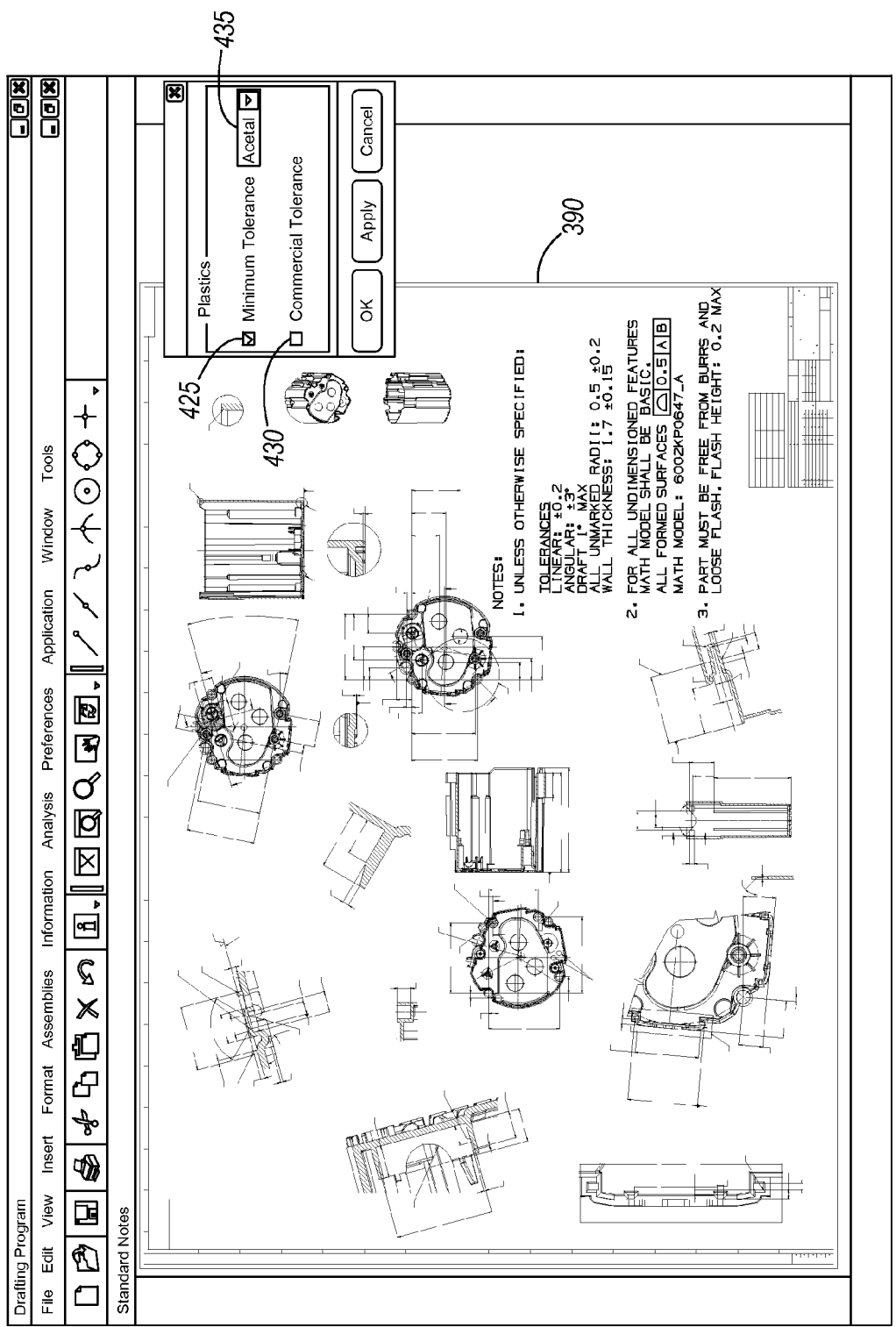
FIG. 11 illustrates a pull-down menu for entering proofing criteria for the plastic tolerance proofing tool.

At step 420 (FIG. 7), the operator enters and the plastic tolerance proofing tool receives proofing criteria. The proofing tool uses the proofing criteria to help determine the type of information to be proofed with the CAD drawing. In the shown implementation (FIG. 11), a drop down menu allows an operator to enter the criteria. In the example of FIG. 11, the menu allows the operator to select analysis for a minimum tolerance 425, select analysis for a commercial tolerance 430, and enter a type of plastic 435. Other criterion can include a production process or technique for manufacturing the apparatus (e.g., blow molding).

At step 445, the plastic tolerance proofing tool converts dimensions and dimension tolerances to nominal dimensions and tolerance ranges. Dimensions and dimension tolerances can be expressed in several formats for a CAD object. These formats include limit tolerances, bilateral tolerances, unilateral tolerances, and unequal bilateral tolerances. To address different formats, the proofing tool converts these and other formats to one type, such as nominal dimensions and tolerance ranges.

At step 450, the plastic tolerance proofing tool acquires (e.g., recalls from memory) information for creating one or more rules, the acquired information being based on the selected criteria. The rules provide conditions the tolerance ranges must follow or meet and/or guidelines the tolerance ranges should follow or meet. For the specific example discussed herein, it will be assumed that the operator selects the tolerance ranges to be compared with minimum tolerance thresholds and commercial tolerance thresholds. However, other comparison values are possible.

FIG. 12 shows a tolerance table 455 that lists a plurality of data values for determining commercial tolerance thresholds and minimum (sometimes referred to as "fine") tolerance thresholds. The plurality of data values is defined with respect to a plurality of plastic materials. In some implementations, the computer readable medium stores the table 455 as a lookup table. Column 460 lists a plurality of plastic materials, column 465 lists a plurality of corresponding commercial tolerance data values, and column 470 lists a plurality of corresponding minimum tolerance data values. In the implementation shown, each of the data values in column 465 includes three commercial tolerance data values—T1c, T2c, and T3c. Similarly, each of the data values in column 470 includes three minimum tolerance data values—T1f, T2f, and T3f. For example, when the operator selects ABS as the type of plastic, the process 450 retrieves three commercial tolerance data values (0.004, 0.012, and 0.003) and three minimum tolerance data values (0.002, 0.008, and 0.002). As will be discussed below, the data values, in one implementation, are applied to a function, which also uses nominal dimensions (e.g., nominal lengths), for determining commercial and minimum tolerance thresholds.

The tool then begins a process (step 475; FIG. 7) to extract items of interest from the CAD object. As already discussed for step 445, a dimension and dimension tolerance may be in a first form and the tool converts the dimensions and dimension tolerance to a nominal dimension and a tolerance range. The extracted item can be the dimension tolerance, the nominal dimension, the tolerance range, and combinations thereof depending on the form of the tolerance. If a tolerance has been obtained (step 480), then the plastic tolerance proofing tool applies the tolerance range to the rule(s) (step 485) and associates a result with the extracted item based on the comparison (step 490).

Figure 13:
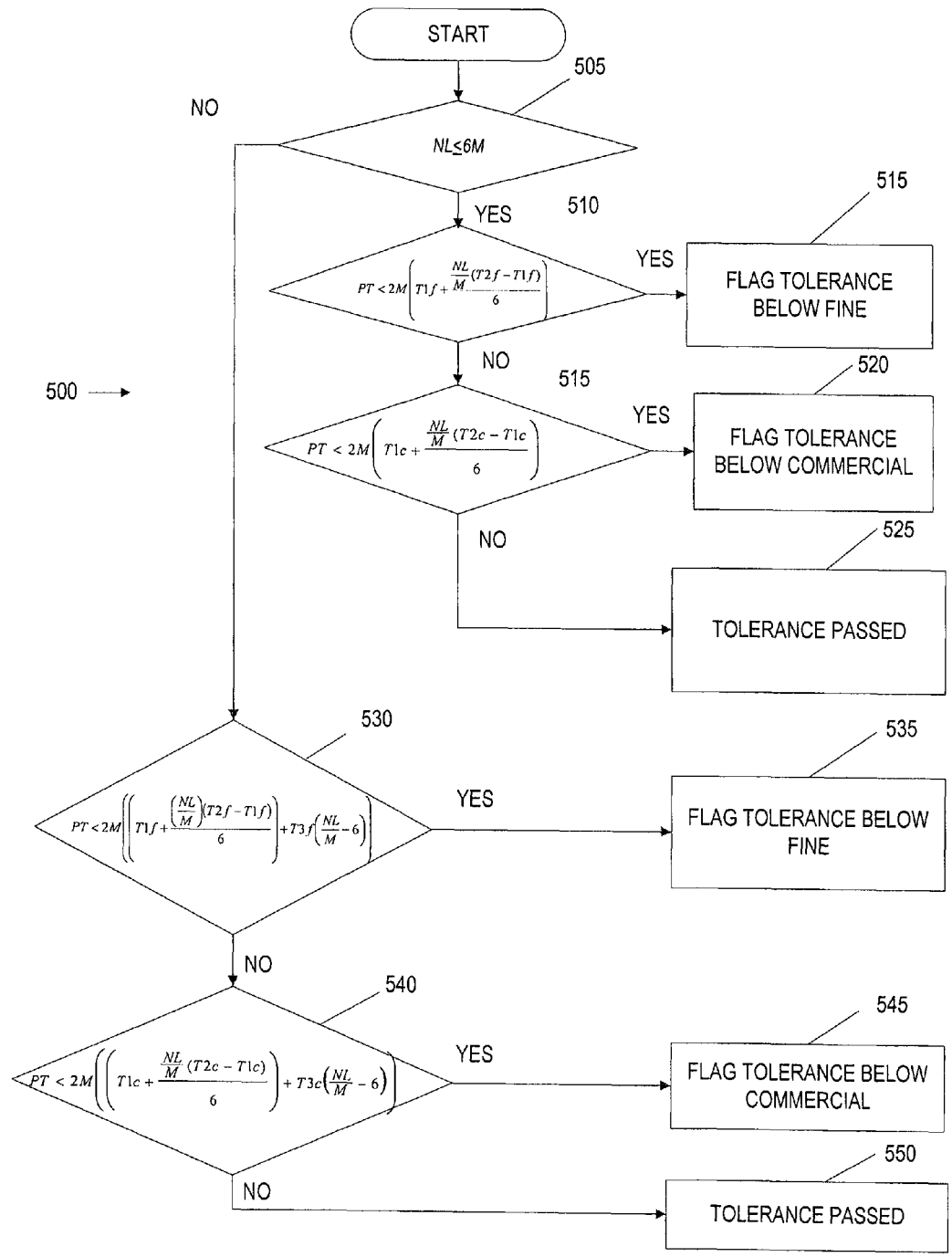
FIG. 13 illustrates a process that further defines one or more steps of the process in FIG. 7.

FIG. 13 shows an exemplary comparison and tagging process 500 for steps 485 and 490. After the user has selected a plastic type (for example, from the list in column 460 of FIG. 12), the corresponding tolerance data values are retrieved, for example, from the lists in columns 465 and 470 of FIG. 12. A nominal length ("NL") or dimension (e.g., dimension 472 of FIG. 4) is extracted from the CAD object and is compared with a multiple of a predetermined constant, M at step 505. In one implementation, M is 25.4 mm per inch (mm/in), and the multiple is 6 inches. If the nominal length is less than or equal to 6M as determined at step 505, the comparison process 500 proceeds to a comparison at step 510. Step 510 compares an extracted tolerance ("PT") (e.g., a tolerance range) with a value (test3) determined from EQN. (1).

$$test3 = 2M\left(T1f + \frac{\frac{NL}{M}(T2f - T1f)}{6}\right) \quad (1)$$

FIG. 13 shows an exemplary comparison and tagging process 500 for steps 485 and 490. After the user has selected a plastic type (for example, from the list in column 460 of FIG. 12), the corresponding tolerance data values are retrieved, for example, from the lists in columns 465 and 470 of FIG. 12. A nominal length ("NL") or dimension (e.g., dimension 472 of FIG. 4) is extracted from the CAD object and is compared with a multiple of a predetermined constant, M at step 505. In one implementation, M is 25.4 mm per inch (mm/in), and the multiple is 6 inches. If the nominal length is less than or equal to 6M as determined at step 505, the comparison process 500 proceeds to a comparison at step 510. Step 510 compares an extracted tolerance ("PT") (e.g., a tolerance range 473 of FIG. 4) with a value (test3) determined from EQN. (1).

$$test3 = 2M\left(T1f + \frac{\frac{NL}{M}(T2f - T1f)}{6}\right) \quad (1)$$

If the extracted tolerance is less than the value (test3) determined from EQN (1) as determined at step 510, the tolerance is tagged, thereby indicating that the tolerance is below a recommended minimum tolerance (step 515). The flag generated at step 515 indicates that the tolerance would be difficult to hold and the associated cost for manufacturing the object may increase. If the extracted tolerance is not less than the value (test3) determined from EQN (1) as determined at step 510, the extracted tolerance is compared with the commercial tolerances at step 515. Particularly, the extracted tolerance is compared with a value (test4) determined from EQN (2).

$$test4 = 2M\left(T1c + \frac{\frac{NL}{M}(T2c - T1c)}{6}\right) \quad (2)$$

If the extracted tolerance is less than the value (test4) determined from EQN (2) as determined at step 515, the tolerance is tagged to indicate the tolerance is below a recommended commercial tolerance (step 520). The flag indicates that the associated cost for manufacturing the object may increase. If the tolerance is not less than the value (test4) determined from EQN (2), the nominal length dimension and its tolerance (step 525) are tagged as passing.

Referring back to step 505, if the nominal length is greater than 6M as determined at step 505, the comparison process 500 proceeds to a comparison at step 530, which compares the extracted tolerance with the minimum tolerance value. Particularly, the extracted tolerance is compared with a value (test5) determined from EQN (3).

$$test5 = 2M\left(\left(T1f + \frac{\left(\frac{NL}{M}\right)(T2f - T1f)}{6}\right) + T3f\left(\frac{NL}{M} - 6\right)\right) \quad (3)$$

If the extracted tolerance is less than the value (test5) determined from EQN (3) as determined at step 530, the extracted tolerance is tagged (step 535) to indicate the tolerance is below a recommended minimum tolerance. The flag indicates that the extracted tolerance is difficult to hold and the associated cost for manufacturing the object may increase. If the extracted tolerance is not less than the value (test5) determined from EQN (3), the comparison process 500 proceeds to compare the extracted tolerance with the commercial tolerance at step 540. The extracted tolerance is compared with a value (test6) determined from EQN (4).

$$test6 = 2M\left(\left(T1c + \frac{\left(\frac{NL}{M}\right)(T2c - T1c)}{6}\right) + T3c\left(\frac{NL}{M} - 6\right)\right) \quad (4)$$

If the extracted tolerance is less than the value (test6) determined from EQN (4), the extracted tolerance is tagged (step 545) to indicate that the tolerance is below a recommended commercial tolerance. The flag indicates that the associated cost for manufacturing the object may increase. If the extracted tolerance is not less than the value (test6), the nominal length dimension and its tolerance (step 550) are tagged as passing.

After completing step 490 (FIG. 7), the tool attempts to extract another item of interest (step 475). The process 375 repeats itself until all tolerances that can be evaluated are analyzed.

Before proceeding further, it should be understood that the functions shown in FIG. 13 (i.e., EQN (1) through EQN (4)) may or may not be based on the selected criteria for the tool. It should also be understood that the functions shown in FIG. 13 can be rearranged such that the extracted tolerance can be applied to the function and the result compared to a comparison value. This is also true for the functions of the other tools. Regardless, it should be apparent that the rules shown in FIG. 13 include a function having one or more variable(s) and a comparison results from the item of interest and the function.

Figure 14:
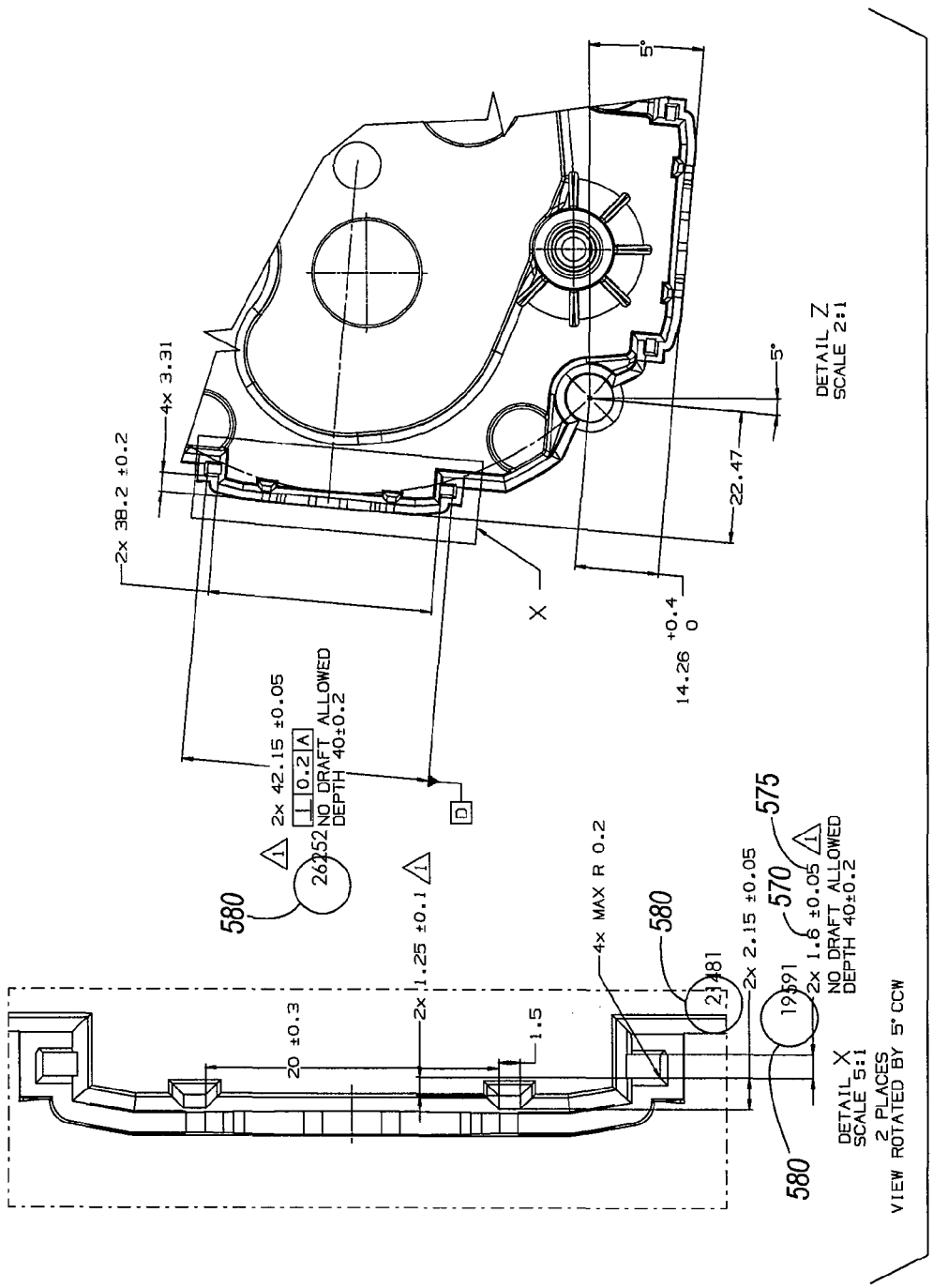
FIG. 14 illustrates a revised portion of the CAD drawing of FIG. 8.

FIG. 9 illustrates a portion of a CAD drawing 390 that includes first and second views 560 and 565. The views 560 and 565 include dimensions 570 and dimension tolerances 575. FIG. 14 illustrates a revised portion of the CAD drawing 390 with indicators 580 indicating flagged items. In some implementations, the indicators 580 include an error number that is enclosed by a circle. In other implementations, the indicators 580 are displayed differently (e.g., an error number enclosed by a different shape, a colored error number, an alternative indicator symbol, etc.). The indicators 580 notify a user that a tolerance does not satisfy a tolerance threshold. The indicators 580 are added to the drawing 120 after the proofing tool is ran. As such, each indicator 580 refers to a step or condition in one of the processes that was not satisfied.

In some implementations, the indicators 580 are interactive such that a user can select the indicator 580 using a user input device while the drawing 120 is displayed on the screen. Selecting the indicator 580 initializes an informational "window" to appear, which can provide the reason that the tolerance was flagged. Additionally or alternatively, descriptive information regarding each identified tolerance can be included in a separate report (described below), as well as a help or user manual. In some implementations, an operator can remove the indicators 580 from the drawing 120 after the indicators 580 have been inspected. For example, the user may print a hard-copy of the drawing 120 with the indicators 580 after the proofing tool is run, and then return the drawing 120 to its prior state (without the indicators 580 being displayed). In some implementations, the flagged (or illegal) indicators 580 include a first indicia or color, and the legal indicators include a second indicia or color. This implementation allows a user to know that the information associated with the legal indicators has passed proofing while the information associated with the illegal indicator 580 has not passed proofing. Further, in another implementation, a third indicia or color, which may be the original color of a dimension or tolerance, is used for items the plastic tolerance proofing tool could not evaluate. It is envisioned that an operator may not properly draw an object such that the tool cannot process a portion of the object. The third indicia or color is applied to the portion of the object that the tool cannot process. This informs the operator to verify these items separately.

Figure 15:
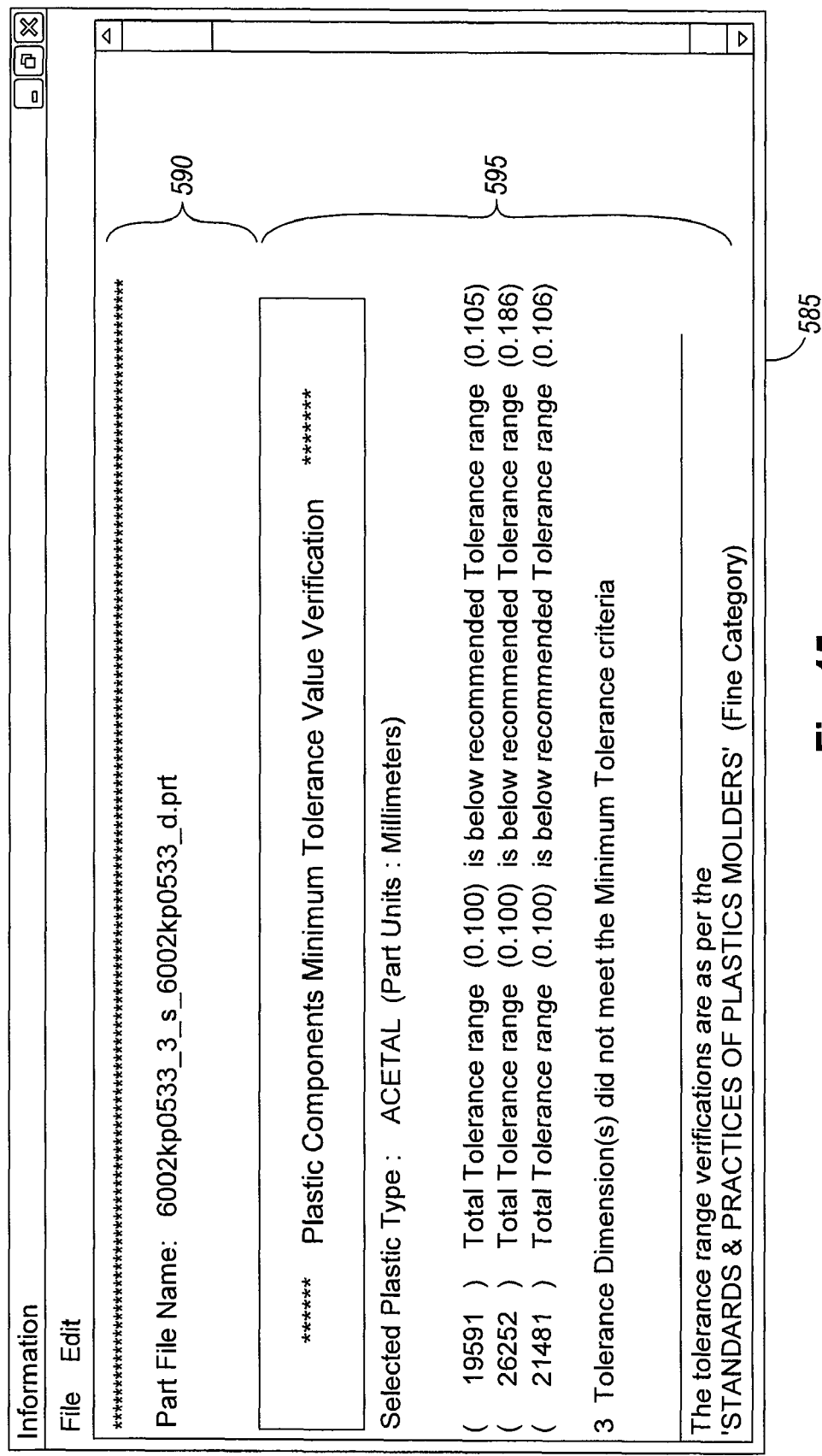
FIG. 15 illustrates a report of a proofed CAD drawing.

FIG. 15 illustrates an exemplary report 585. In some implementations, the report 585 is created by the plastic tolerance proofing tool after the tool has identified the flagged items in the drawing 390. As such, the report 585 is linked to the drawing 390 such that each indicator 580 included in the drawing 390 corresponds to a portion of the report 585. The report 585 generally includes a drawing information portion 590 and a tool information portion 595. The drawing information portion 595 recites information about the drawing, including the file name. However, the drawing information portion 590 may include more or less information than that shown in FIG. 15. For example, in an alternative implementation, the drawing information portion 590 also includes information regarding the date of drawing creation, the drawing revision, etc.

The tool information portion 595 provides information about each flagged item. In some implementations, the information is grouped by illegal indicator (e.g., the error code of the illegal indicator). Descriptive fields can be included with each error code to provide a full description of the illegally applied application. Additionally, in some implementations, a user manual section field is also included.

In some implementations, a user or help manual is included with the proofing tool. The help manual provides detailed information about each step of the process. An operator can reference the help manual to obtain more details about each error, as well as possible correction instructions or procedures to remedy the error.

Therefore, the plastic tolerance proofing tool automatically checks CAD objects to verify if all the tolerances on the drawing are considered manufacturable. The thresholds can be based on, for example, thresholds calculated using information from the resource Standards & Practices of Plastic Molders, available from the Society of the Plastics Industry, Inc. The information can be stored similar to the functions and values discussed above, and can be used as the basis for creating rules, similar to disclosure for FIG. 13. The tool can also calculate and print the smallest tolerance that would be manufacturable.

It should also be understood that FIG. 13 and the related description is one technique for proofing a tolerance with multiple thresholds. However, other techniques can be used. Further, the proofing tool can include information to create rules for other items of interest for the CAD object. For example, different threshold limits can be set or calculated for various locations or features of size. Exemplary items of interest include an inside radius, an outside radius, a thickness of a portion of the apparatus, and a diameter of an aperture (such as a flow-around hole). Other measures known to be of concern for plastic manufacturers are possible.

Casting Tolerance Proofing Tool

Figure 16:
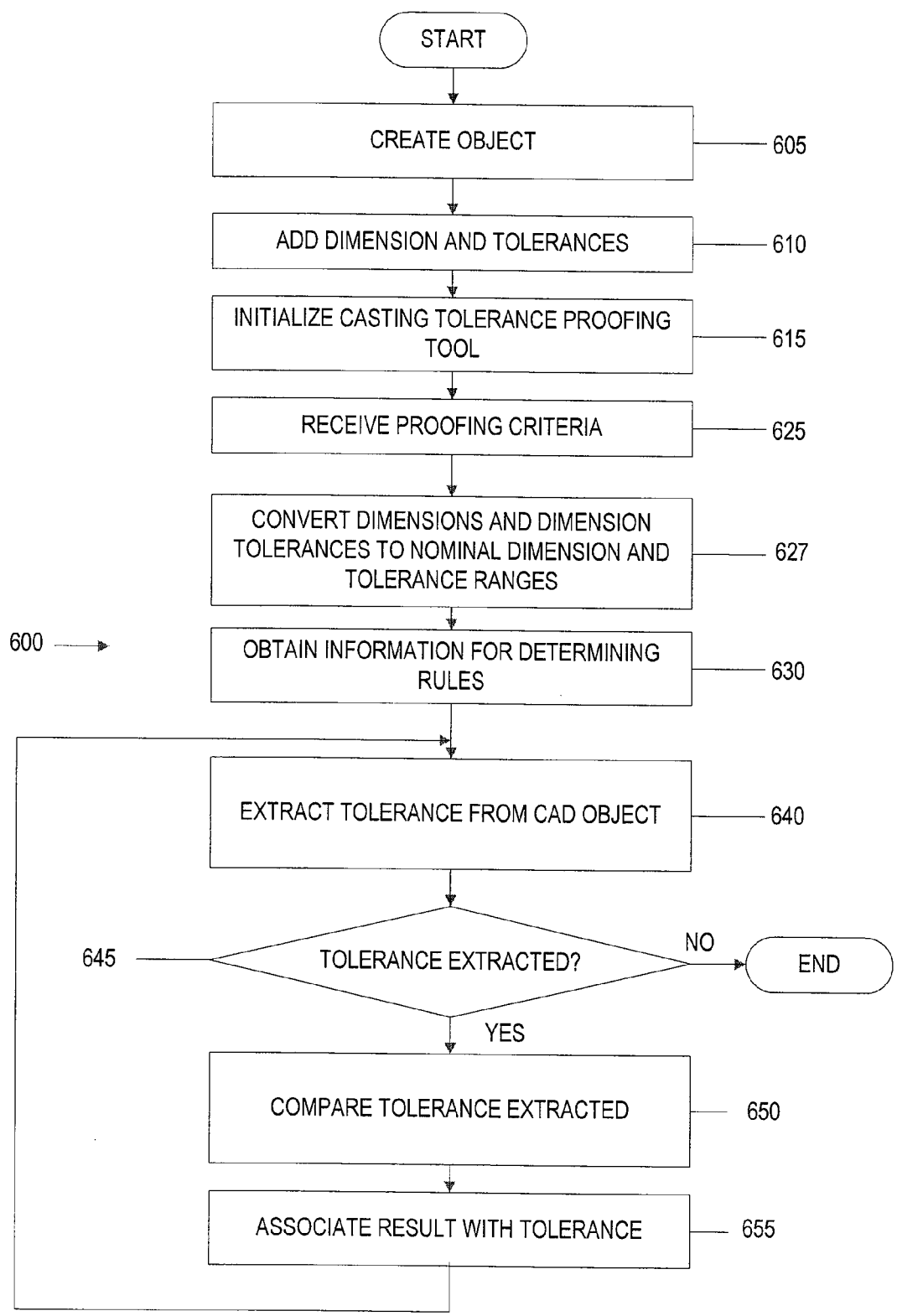
FIG. 16 illustrates an exemplary process for a casting tolerance proof.
Figure 17:
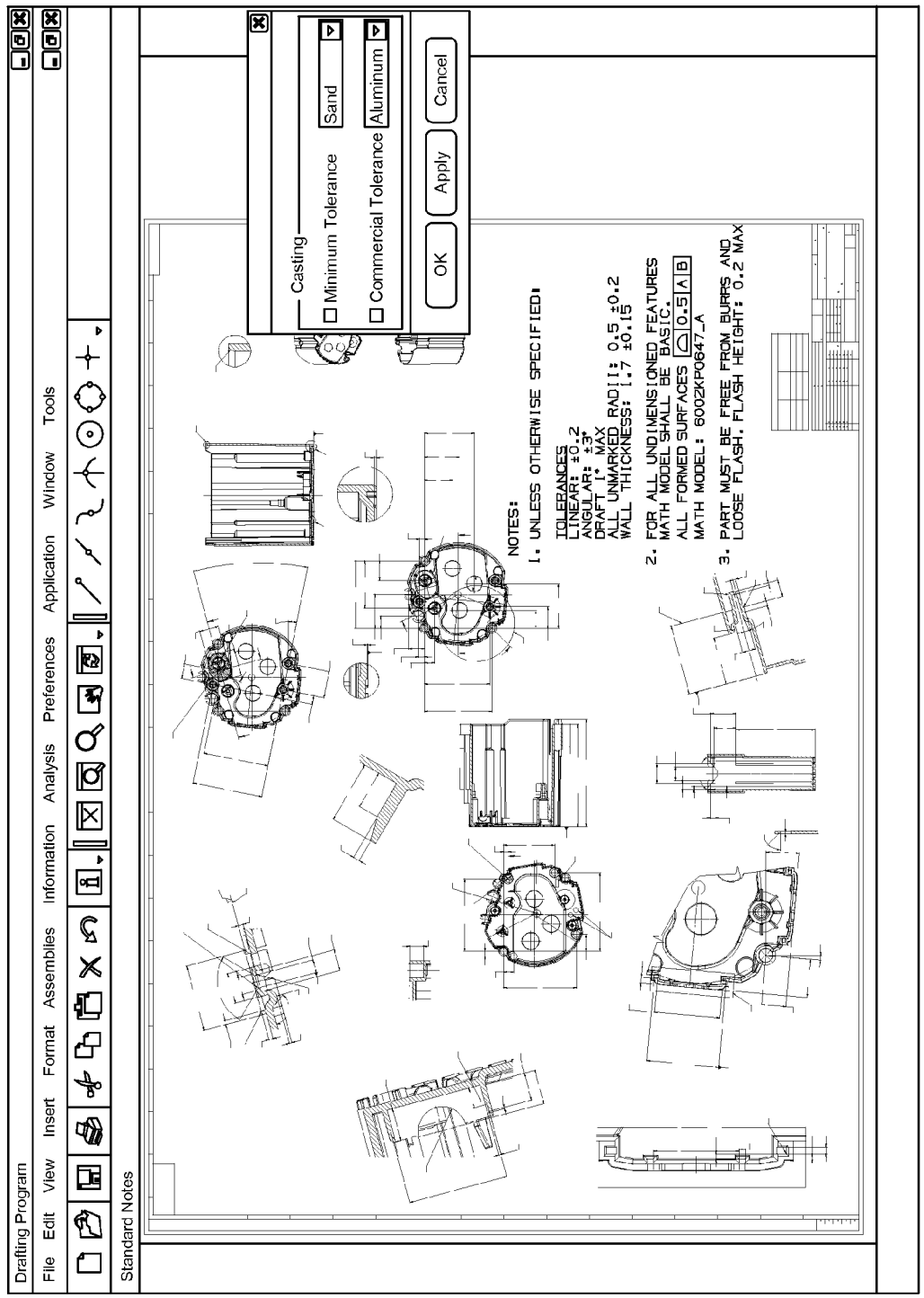
FIG. 17 illustrates a pull-down menu for entering proofing criteria for the casting tolerance proofing tool.

FIG. 16 discloses a process 600 for performing a casting tolerance proof. The process 600 begins by creating a CAD object (step 605). The CAD object is created using the CAD software application and the computer 100 shown in FIG. 1. After and/or while the CAD object is being created, dimensions and dimension tolerances are applied to the CAD object (step 610). FIG. 8 shows a CAD drawing 390 having multiple drawing views that correspond to the same apparatus (e.g., a top view, a front view, an isometric view, etc.). FIG. 9 shows a portion of the CAD drawing of FIG. 8. After completing the CAD object and applying information, the casting tolerance proofing tool is initialized (step 615; FIG. 16). In the shown implementation, the casting tolerance proofing tool is a knowledge-based software tool that is added onto (or integrated into) the CAD software platform (e.g., Unigraphics). The casting tolerance proofing tool is initialized by a user while operating the CAD software application. The operator chooses to initialize the validation tool by selecting "Cast-TolCheck" 620 (FIG. 10) in the proofing tool pull-down menu 410 while constructing the CAD drawing 390.

At step 625, the operator enters and the casting tolerance proofing tool receives proofing criteria. The proofing tool uses the proofing criteria to determine the type of information to be checked with the CAD object. In the shown implementation (FIG. 17), the criteria are the manufacturing or casting process (i.e., sand casting, permanent mold casting, or die casting). Other criteria can include a type of cast material, or threshold criteria (e.g., minimum threshold, commercial threshold, etc).

At step 627, the casting tolerance proofing tool converts dimensions and dimension tolerances to a nominal dimension and a tolerance range. Dimensions and dimension tolerances can be expressed in several formats for a CAD object. These formats include limit tolerances, bilateral tolerances, unilateral tolerances, and unequal bilateral tolerances. To address different formats, the proofing tool converts these and other formats to one type, such as nominal dimensions and tolerance ranges.

Figure 18:
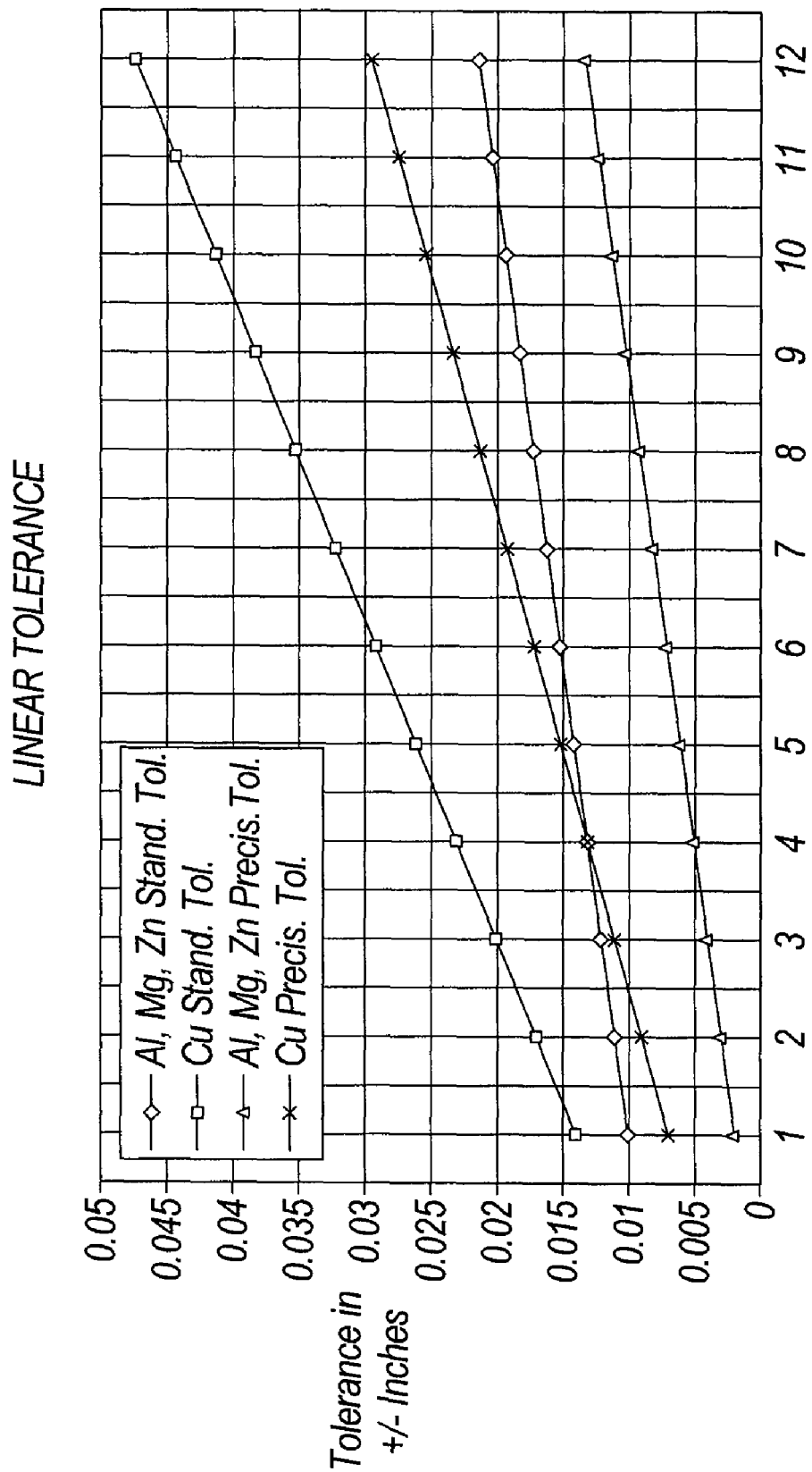
FIG. 18 is a graph representing a linear tolerance in +/− inches versus linear dimension in inches.

At step 630, the casting tolerance proofing tool obtains (e.g., recalls from memory) information for determining one or more rules, the obtained information being based on the selected criteria. The rules provide conditions the entered tolerances (i.e., the items of interest) must follow or meet or guidelines the entered tolerances should follow or meet. For example, FIG. 18 provides a linear tolerance graph representing the tolerance +/− inches versus liner dimension inches for multiple materials. The graph also provides a standard (or commercial) tolerance and precision (or minimum) tolerances for the different materials. The graph can be obtained from the NADCA Product Specification Standards for Die Castings. Similar graphs can be obtained for other processes and materials. Other information found in the NADCA Product Specification Standards for Die Castings, for example, can be used to define additional rules.

The graph shown in FIG. 18 can be represented as functions similar to the discussion above for FIG. 13 of the plastic tolerance validation tool. That is, the lines shown in FIG. 18 can take the form of $y=mx+b$, where the values m and b are stored in a tolerance table similar to FIG. 12. The tolerance table can list a plurality of data values, such as commercial data values and minimum data values, with respect to a plurality of criteria, such as the type of metal and design process. In some implementations, a computer readable medium stores the table 300 as a lookup table. Based on the selected material and the casting process, the casting tolerance proofing tool retrieves the corresponding data values, which are the basis for creating threshold values or rules.

The tool then begins a process (step 640; FIG. 16) to extract items of interest from the CAD object. As already discussed for step 627, a dimension and dimension tolerance may be in a first form and the tool converts the dimension and dimension tolerance to a nominal dimension and a tolerance range. The extracted item can be the dimension tolerance, the nominal dimension, the tolerance range, and combinations thereof depending on the form of the tolerance. If a tolerance has been obtained (step 645), then the cast tolerance proofing tool compares the tolerance range to the rule(s) (step 650) and associates a result with the extracted item based on the comparison (step 655).

Figure 19:
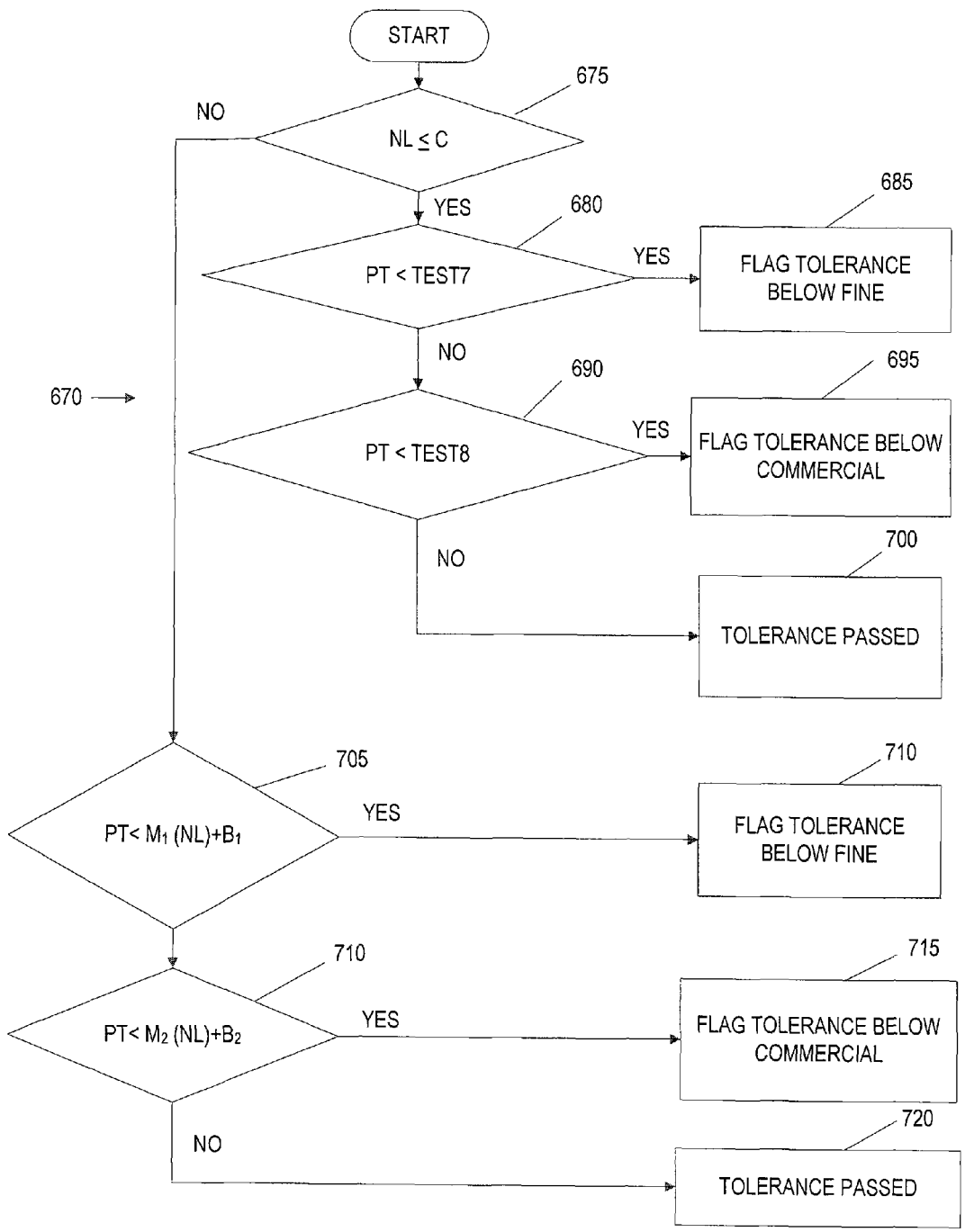
FIG. 19 illustrates a process that further defines one or more steps of the process in FIG. 16.

FIG. 19 shows an exemplary comparison and flagging process 670 for steps 650 and 655. After the CAD operator has selected criteria (for example, aluminum and die casting), the corresponding tolerance data values are retrieved. A nominal length ("NL") or dimension is compared with a predetermined constant, C, at step 675. In one implementation, C is 1 inch. If the nominal length is less than or equal to C as determined at step 675, the comparison process 670 proceeds to a comparison at step 680. The step 680 compares an extracted tolerance ("PT") with a value (test7). For example, the value (test7) can be 0.002 inches for die cast aluminum.

If the extracted tolerance (e.g., the tolerance range) is less than the value (test7) as determined at step 680, the tolerance is tagged, thereby indicating that the tolerance is below a recommended minimum tolerance threshold (step 685). The flag generated at step 685 indicates that the tolerance would be difficult to hold and the associated cost for manufacturing the object may increase. If the extracted tolerance is not less than the value (test7) as determined at step 680, the extracted tolerance is compared with the commercial tolerance threshold at step 690. Particularly, the extracted tolerance is compared with a value (test8). For example, the value (test8) can be 0.014 inches for die cast aluminum.

If the extracted tolerance is less than the value (test8) as determined at step 690, the tolerance is tagged to indicate the tolerance is below a recommended commercial tolerance threshold (step 695). The flag indicates that the associated cost for manufacturing the object may increase. If the tolerance is not less than the value (test8), the nominal length dimension and its tolerance (step 700) are tagged as passing.

Referring back to step 675, if the nominal length is greater than C, the comparison process 670 proceeds to a comparison at step 705, which compares the extracted tolerance with the minimum tolerance threshold. Particularly, the extracted tolerance is compared with a value (test9) determined from EQN (5).

$$(test9)=M_1(NL)+B_1 \quad (5)$$

$M_1$ and $B_1$ can be obtained from memory and be based on the graph 635 shown in FIG. 18.

If the extracted tolerance is less than the value (test9) as determined at step 705, the extracted tolerance is tagged (step 710) to indicate the tolerance is below a recommended minimum tolerance. The flag indicates that the extracted tolerance is difficult to hold and the associated cost for manufacturing the object may increase. If the extracted tolerance is not less than the value (test9), the comparison process 670 proceeds to compare the extracted tolerance with the commercial tolerances threshold at step 710. The extracted tolerance is compared with a value (test10) determined from EQN (6).

$$(test10)=M_2(NL)+B_2 \quad (6)$$

$M_2$ and $B_2$ can be obtained from memory and be based on the graph 635 shown in FIG. 18.

If the extracted tolerance is less than the value (test10), the extracted tolerance is tagged (step 715) to indicate that the tolerance is below a recommended commercial tolerance is generated. The flag indicates that the associated cost for manufacturing the object may increase. If the extracted tolerance is not less than the value (test10), the nominal length dimension and its tolerance (step 720) are tagged as passing.

After completing step 655 (FIG. 16), the tool attempts to extract another tolerance (step 640). The process 600 repeats itself until all tolerances that can be evaluated are analyzed.

Therefore, the cast tolerance proofing tool automatically checks CAD objects to verify if the tolerances on the object are considered manufacturable. The thresholds can be based on, for example, thresholds calculated using information from the resource NADCA Product Specification Standards for Die Castings, available from the North American Die Casting Association. The information can be stored similar to the functions and values discussed above, and can be used with the nominal lengths for creating rules. The tool can also calculate and print the smallest tolerance that would be manufacturable.

It should also be understood that FIG. 19 and the related description is one technique for proofing a tolerance with multiple thresholds. However, other techniques can be used. Further, the proofing tool can include information to create rules for other items of interest in the CAD object. For example, different threshold limits can be set or calculated for various locations or features of size. Exemplary items of interest include an inside radius, an outside radius, a thickness of a portion of the apparatus, and a concern for cast manufacturers are possible.

It is also envisioned that the CAD drawing 390 can be revised to disclose the result of the cast tolerance proofing tool similar to the discussion above for the plastic tolerance proofing tool. The discussion above for FIGS. 9, 14, and 15 apply similarly for the cast tolerance proofing tool.

Note Proofing Tool

Figure 20:
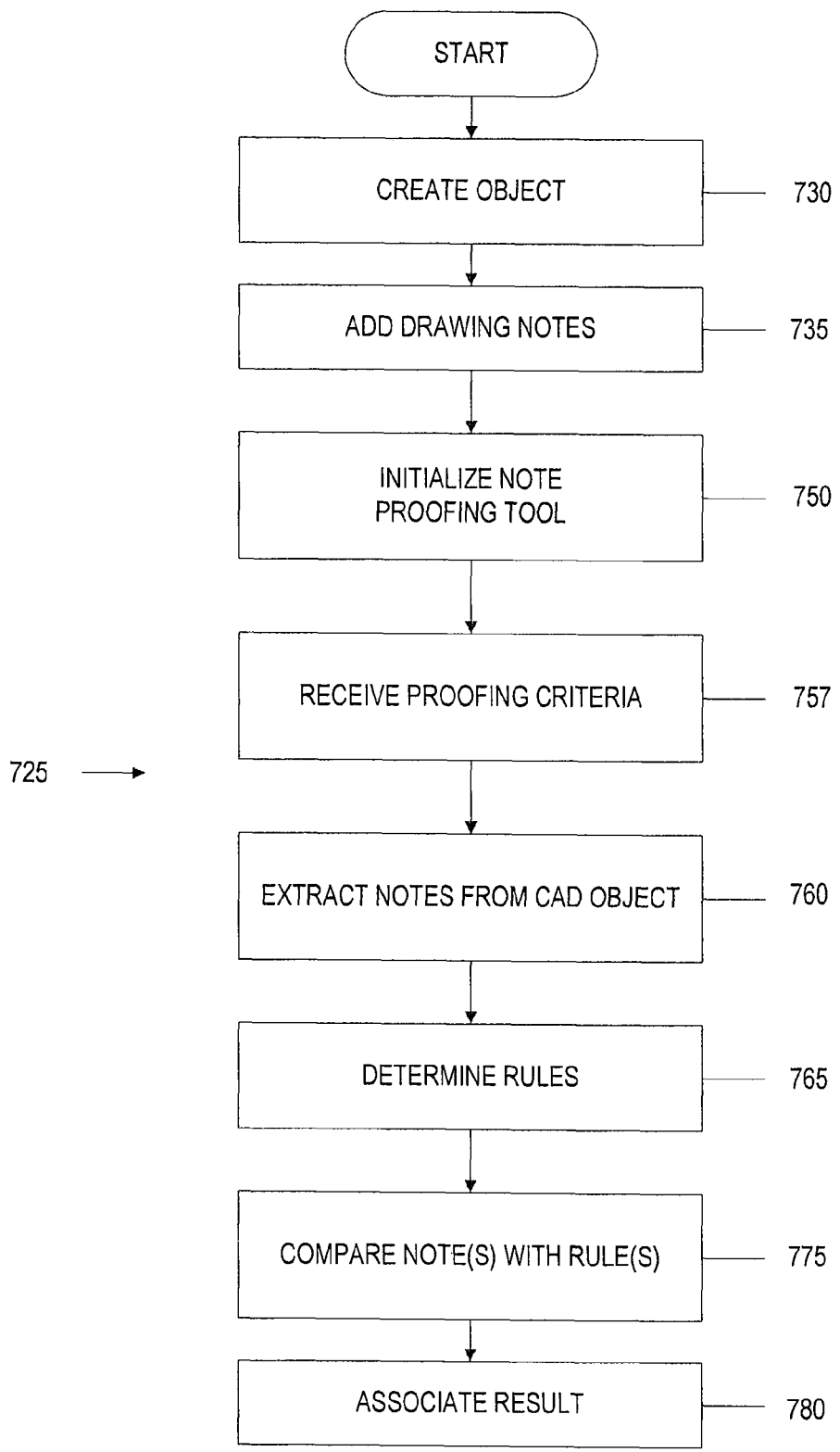
FIG. 20 illustrates an exemplary process for a note proofing tool.
Figure 21:
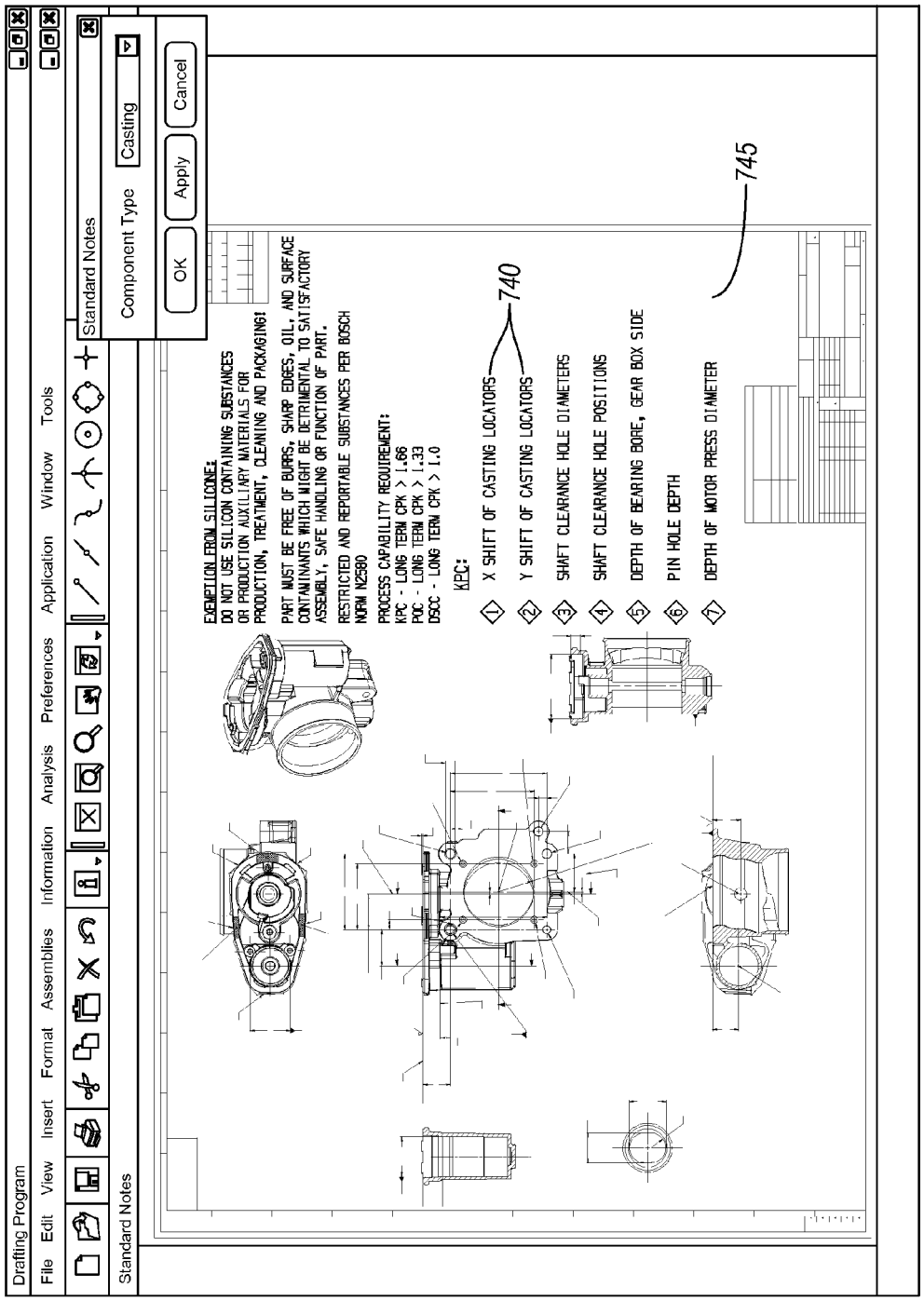
FIG. 21 illustrates a CAD drawing created with the system in FIG. 1, the CAD drawing having a legend.

FIG. 20 discloses a process 725 for proofing notes. The process 725 begins by creating a CAD object (step 730). The CAD object can be created, for example, using a CAD software application and the computer 100 shown in FIG. 1. After and/or while the CAD object is being created, drawing notes (information, descriptions, etc.) are applied to the CAD object (step 735). Typically, the drawing notes are applied to the CAD object in a legend. For example, as shown in FIG. 21, the notes 740 include information entered in the legend 745. Example drawing notes include legal descriptions or requirements, restrictions (government, material, etc.), default tolerances, methods of inspection, dimension type (metric, English, etc.), format, etc. The GD&T for the exemplary CAD drawing shown in FIG. 21 have been removed because the specific values are inconsequential for the invention herein. However, one skilled in the art would understand that the CAD drawing shown in FIG. 21 would include GD&T.

After completing the CAD object and applying information, the note proofing tool is initialized (step 750; FIG. 20). In the shown implementation, the note proofing tool is a knowledge-based software tool that is added onto (or integrated into) a CAD software platform (e.g., Unigraphics). The note proofing tool is initialized by a user while operating the CAD software application. The operator chooses to initialize the validation tool by selecting the "StdNotesToolDlg" 755 (FIG. 10) in the proofing tool pull-down menu 410.

At step 757, the operator enters and the notes proofing tool receives proofing criteria. The notes proofing tool uses the proofing criteria for determining the rules for proofing the CAD object. An example criterion includes a manufacturing process. Other criteria can include a type of material, a manufacturer, a standard for the manufacturing process, etc.

At step 760, the note proofing tool extracts notes from the CAD object. During creation of the CAD object, the operator enters notes as is customary for the CAD software. In some variations, the CAD software is able to identify each note and the extraction of the notes is based on the functionality of the software.

At step 765, the tool obtains (e.g., recalls from memory) information for determining one or more rules. It should be understood that the obtained information can be the rule, be used to create the rule, or be used as part of the rule. The selection of the rules can be based on the entered proofing criteria.

In general, there are three types of rules for the note proofing tool. The first type of rules is rules directed to general notes that should appear on all drawings. If no notes satisfy a rule of the first type, then the report would recommend that this note be added. If the CAD object includes a note similar but not identical to a rule of the first type, then the report would recommend that this note be changed.

The second type of rules is rules directed to notes that should appear on all drawings that are subject to the entered proofing criteria. If no notes satisfy a rule of the second type, then the report would recommend that this note be added. If the CAD drawing includes a note similar but not identical to a rule of the second type, then the report would recommend that this note be changed.

The third type of rules is rules directed to notes that are frequently used but are not always required. A rule of the third type may or may not be based on the received proofing criteria. If the CAD drawing includes a note similar but not identical to a rule of the third type, then the report would recommend that this note be changed.

In the implementation discussed herein, each rule includes a series of keywords for defining the rule. The series of keywords may require an order and may not define a complete sentence. As used herein, a keyword is a segment of written or printed discourse ordinarily appearing between spaces or between a space and a punctuation mark. A keyword does not need to be a word capable of being spoken (e.g., the keyword is jargon, a mixture of letters and numbers, etc.).

For each rule, i.e., for each series of keywords, the note proofing tool compares the rule to the note (step 775). The comparison determines whether the rule has been satisfied. Depending on the type of rule and the comparison, a result is associated with the rule and/or the note (step 780).

In a more specific implementation of steps 775 and 780, the note proofing tool compares the rule to an extracted note. In one implementation, the tool recognizes characters of the extracted note (e.g., spaces, punctuation, numbers, mathematical symbols, text) and divides or groups the note into words. Similar to keywords, a word is a segment of written or printed discourse ordinarily appearing between spaces or between a space and a punctuation mark. A word from a note does not need to be a word capable of being spoken. The note proofing tool can then compare keywords or series of keywords of the rule to words or series of words of the note.

If the rule has been satisfied, the tool associates a tag with at least one of the rule and the note. The flag for the rule can indicate the rule has been passed and the flag for the note can indicate that the note has passed a rule. If the rule was not completely satisfied, then the tool determines whether the rule has been partially satisfied. For example, a note may closely resemble a rule. If this occurs, the tool can flag the note and the rule and, if the note does not satisfy another rule, the tool can identify the extracted note as partially satisfying a rule.

It is envisioned that, if a note has satisfied a rule, the note can be identified with a first indicator (e.g., a first color). If a note partially satisfies a rule, the note can be identified with a second indicator (e.g., a second color), and a report can identify the partially satisfied rule with a suggested alternate phrasing. If a note has not been evaluated, the note can be identified with a third indicator (e.g., a third color), and the operator can separately review the note. If a rule of a first or second type is partially satisfied, a report can identify the rule, the note(s) that partially satisfy the rule, and a suggested alternative phrasing. If a rule of the first or second type is neither satisfied nor partially satisfied, a report can identify the rule and a suggested phrasing for a note. If a rule of the third type is partially satisfied, then the report could identify the rule, the note(s) that partially satisfy the rule, and a suggested alternative phrasing.

It is envisioned that, in some implementations, the note proofing tool compares each of the drawing notes with a single rule before proceeding to a next rule (similar to the description for FIG. 6). This typically occurs for the first and second types of rules since each rule of these types is required in the CAD object. It is also envisioned that, in some implementations, the note proofing tool compares a single drawing note with a plurality of rules before proceeding to the next drawing note (similar to the description for FIG. 5). This typically occurs for the third type of rules since many rules of this type may not be present in the CAD object. It is also envisioned, that the CAD object may not include any drawing notes prior to the activation of the note proofing tool. For this situation, the note proofing tool would indicate that notes for each of the rules of the first and second type need to be added to the CAD object, which may be done automatically.

Stamped Metal Proofing Tool

Figure 22:
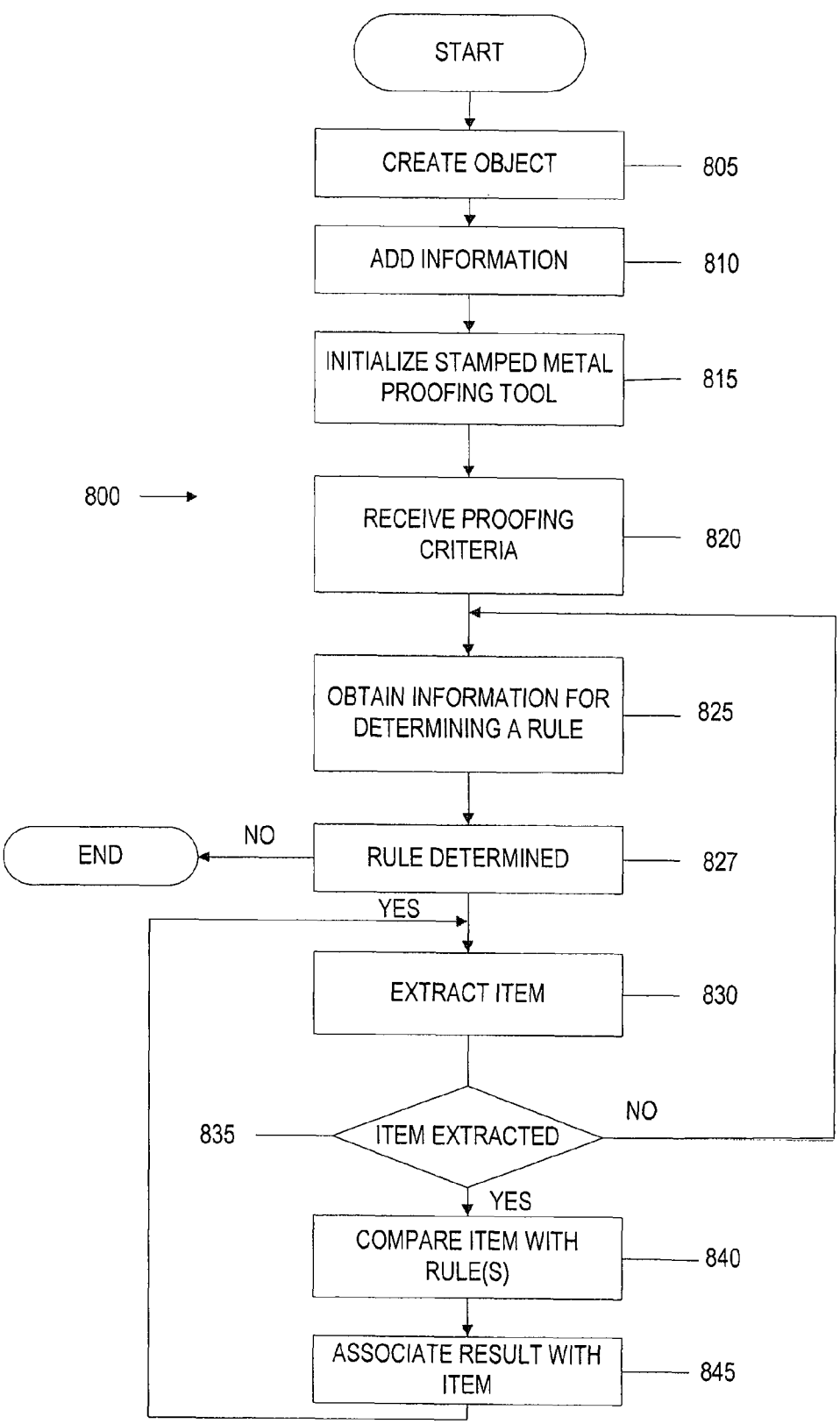
FIG. 22 illustrates an exemplary process for a stamped metal proofing tool.
Figure 23:
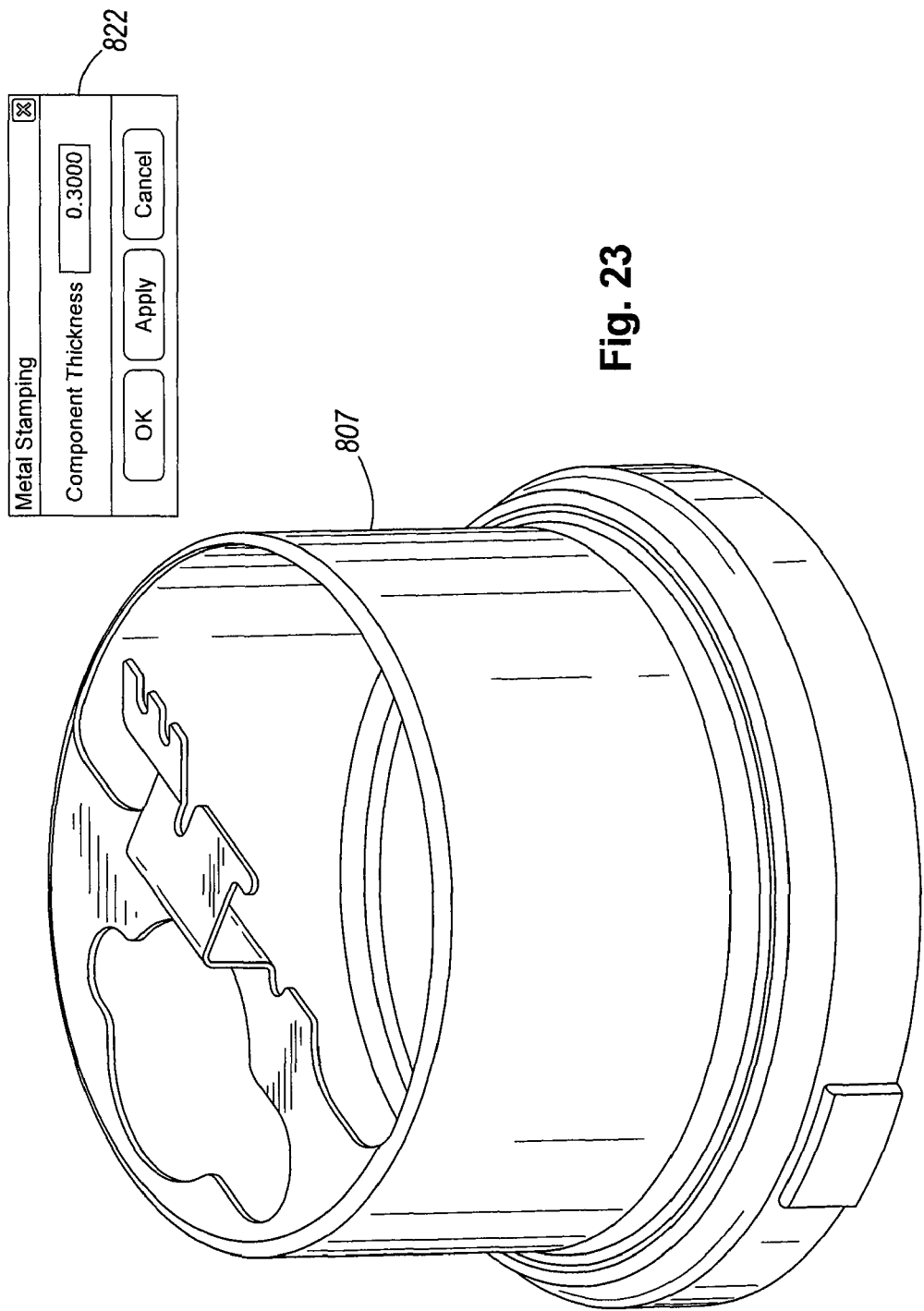
FIG. 23 illustrates a CAD model created with the system in FIG. 6.

FIG. 22 discloses a process 800 for performing a stamped metal proofing tool. The process 800 begins by creating a CAD object (step 805). The CAD object is created using the CAD software application and the computer 20 shown in FIG. 1. FIG. 23 shows a 3-D modeled apparatus 807. After and/or while the CAD object is being created, information (e.g., dimensions and dimension tolerances) is applied to the CAD object (step 810). At step 815, the stamped metal proofing tool is initialized. In the shown implementation, the stamped metal proofing tool is a knowledge-based software tool that is added onto (or integrated into) the CAD software platform (e.g., Unigraphics). The stamped metal proofing tool is initialized by a user while operating the CAD software application. The operator chooses to initialize the proofing tool by selecting "MetalStampingDLG" 817 (FIG. 10) in the proofing tool pull-down menu 410 after constructing the CAD object.

At step 820, the operator enters and the proofing tool receives proofing criteria. The proofing tool uses the proofing criteria to determine the type of information to be checked with the CAD object. In the shown implementation, the criterion is the thickness of the sheet metal 822. Other criteria can include a hardness of the sheet material, threshold criteria, type of material, and hardness of the material. It is also envisioned that the tool can be used for other planer materials such as cardboard or plastic.

At step 825, the stamped metal proofing tool obtains (e.g., recalls from memory) information for determining one or more rules. The obtained information can be based on the selected criteria. In some implementations, however, additional information may not be required for the rules. That is, the rules may take the form of a sequence of steps that does not need any additional information beyond the entered criteria (e.g., the thickness of the metal).

For example, the rules provide conditions that items of interest must follow or meet or guidelines the items of interest should follow or meet. More specifically, one rule a stamped apparatus might need to meet is that a hole diameter (HD) should be greater than or equal to the sheet metal thickness (T) multiplied by a constant (C). This rule may be set in the tool with a set constant (e.g., C=1.2). Alternatively, the constant C may be stored in memory and be selected based on entered criteria (e.g., the hardness of the metal). The data necessary to determine the constant C can be obtained from known sources.

Similar functions and data values can be obtained for other aspects to be proofed by the stamped metal proofing tool. The functions can be obtained from known sources relating to sheet metal preferred practices. Other exemplary rules include a distance of an edge to a hole being greater than or equal to a constant multiplied by the thickness, a distance of a hole to a form being greater than or equal to a constant multiplied by the thickness, a tab width being greater than or equal to a constant multiplied by the thickness, a notch width being greater than or equal to a constant multiplied by the thickness, a distance from a form to an edge of a hole being greater than or equal to a constant multiplied by the thickness, an internal radius greater than or equal to a constant multiplied by the thickness, an external radius greater than or equal to a constant multiplied by the thickness, and a distance from an edge to the straight side of a slotted hold greater than or equal to a constant multiplied by the thickness. Even further exemplary rules include comparing a bend radius to a threshold based on the thickness of the material, the type of the material, and the hardness of the material; and comparing a tolerance range to a threshold based on a nominal dimension.

The tool then proceeds (step 827) to extract an item of interest (step 830) from the CAD object. The extracted item is typically based on the current rule determined at step 827. For example, if the rule is comparing a hole diameter to a threshold, then the extracted item includes a selection of a hole and its related diameter. In some implementations, the CAD software package (e.g., Unigraphics) includes macros for extracting the items of interest. For example, the CAD software can include a macro to extract all hole diameters in the CAD object. Of course, the order of steps shown in FIG. 22 may vary if all items of a macro are extracted at one time.

After extracting an item of interest (step 835), the tool compares the item with the rule (step 840) and associates a result with the item based on the comparison (step 845). For example, a hole diameter can be compared to the thickness of the sheet metal, and a result is tagged to the diameter based on the comparison. If the extracted diameter is less than the thickness multiplied by a constant, then the diameter is tagged, thereby indicating that the diameter is below a recommended threshold. The flag generated at step 685 indicates, for example, that the hole would be difficult to punch properly or frequent tool repair may be required.

After completing step 845, the tool obtains another item (step 640). The process repeats itself until all items relating to the rule are analyzed.

Therefore, the stamped metal proofing tool automatically checks CAD objects to verify if the items of the object are considered manufacturable. It should also be understood that FIG. 22 and the related description is one technique for proofing a CAD object with multiple rules. However, other techniques can be used. It is also envisioned that the model 807 can be revised to disclose the result of the cast tolerance proofing tool similar to the discussion above for the plastic tolerance proofing tool. The discussion above for FIGS. 9, 14, and 15 apply similarly for the stamped metal proofing tool. However, in some implementations, the flag can be applied to the 3D-model, rather than the 2D-drawings.

Accordingly, the invention provides new and useful systems, methods, and tools for proofing a computer-aided design object. Various features and advantages of the invention are set forth in the following claims.

What is claimed is:

1. A casting tolerance proofing tool stored in a memory of a computer system, the computer system having a processor, the memory storing a CAD object of an apparatus to be manufactured with a casting process, the tool comprising:
    a criteria selector operable to prompt for and receive a type of casting process for the apparatus to be manufactured with;
    an extractor operable to determine a nominal dimension and a related tolerance from the CAD object;
    a rule module operable to
        obtain a first data value from the memory, the first obtained data value being based on the specified type of casting process,
        obtain a second data value from the memory, the second obtained data value being based on the specified type of casting process,
        obtain a function having a variable,
        determine a first threshold based on the function, the first obtained data value and the nominal dimension, the first threshold corresponding to a commercial tolerance threshold, and
        determine a second threshold based on the function, the second obtained data value, and the nominal dimension, the second threshold corresponding to a minimum tolerance threshold;
    a comparator operable to compare the tolerance with the first threshold and the second threshold; and
    a tagging module operable to tag the CAD object based on the comparisons.

2. The proofing tool of claim 1, wherein the function is based on the specified type of casting process.

3. The proofing tool of claim 1, wherein the rule module is further operable to apply the nominal dimension and the first obtained data value to the function in order to determine the first threshold.

4. The proofing tool of claim 1, wherein the tagging module is further operable to attach a flag to the tolerance when the tolerance traverses the first threshold.

5. The proofing tool of claim 1, wherein the rule module is further operable to generate a replacement tolerance, and replace the tolerance with the replacement tolerance.

6. The proofing tool of claim 1, wherein the memory includes a data table.

7. The proofing tool of claim 6, wherein the rule module is operable to obtain the first data value from the data table based on the specified type of casting process, and the second data value from the data table based on the specified type of casting process.

8. The proofing tool of claim 1, wherein the rule module is operable to obtain the first data value based on a manufacturer of the apparatus.

9. The proofing tool of claim 1, wherein the rule module is operable to obtain the first data value based on an end entity for the apparatus.

10. The proofing tool of claim 1, wherein the rule module is operable to obtain the first data value based on a country the apparatus will be delivered to.

11. The proofing tool of claim 1, wherein the tagging module is further operable to attach a first flag to the tolerance when the tolerance traverses the first threshold and attach a second flag to the tolerance when the tolerance traverses the second threshold, the second flag being different from the first flag.

12. The proofing tool of claim 1, wherein the criteria selector is further operable to prompt for and receive a type of material for the apparatus to be manufactured in.

13. The proofing tool of claim 12, wherein the rule module is operable to obtain the first data value based on the type of material.

14. A method of proofing a design for an apparatus, the method being performed with a computer system having a processor and memory, the method comprising:
   receiving a CAD object of the apparatus;
   prompting for a type of manufacturing process for the apparatus to be manufactured with;
   receiving a response specifying the type of manufacturing process;
   determining a nominal dimension and a related tolerance from the CAD object;
   obtaining a first data value from the memory, the first obtained data value being based on the specified type of manufacturing process;
   obtaining a second data value from the memory, the second obtained data value being based on the specified type of manufacturing process;
   obtaining a function having a variable;
   determining a first threshold based on the function, the first obtained data value, and the nominal dimension;
   determining a second threshold based on the function, the second obtained data value, and the nominal dimension, the second threshold corresponding to a minimum tolerance threshold;
   comparing the tolerance with the first threshold;
   comparing the tolerance with the second threshold; and
   tagging the CAD object based on the comparisons.

15. The method of claim 14, wherein the manufacturing process includes casting.

16. The method of claim 15, wherein the casting includes sand casting, permanent mold casting, or die casting.

17. A manufacturing tolerance proofing tool stored in a memory of a computer system, the computer system having a processor, the memory storing a CAD object of an apparatus to be manufactured with a process, the tool comprising:
   a criteria selector operable to prompt for and receive a type of a manufacturing process for the apparatus to be manufactured with;
   an extractor operable to determine a nominal dimension and a related tolerance from the CAD object;
   a rule module operable to
      obtain a first data value from the memory, the first obtained data value being based on the specified type of manufacturing process,
      obtain a second data value from the memory, the second obtained data value being based on the specified type of manufacturing process,
      obtain a function having a variable,
      determine a first threshold based on the function, the first obtained data value and the nominal dimension,
      determine a second threshold based on the function, the second obtained data value, and the nominal dimension, the second threshold corresponding to a minimum tolerance threshold;
   a comparator operable to compare the tolerance with the first threshold and the second threshold; and
   a tagging module operable to tag the CAD object based on the comparisons.

18. The proofing tool of claim 17, wherein the manufacturing process includes casting.

19. The proofing tool of claim 17, wherein the casting includes sand casting, permanent mold casting, or die casting.

* * * * *